(12) United States Patent
Fang et al.

(10) Patent No.: US 8,619,974 B2
(45) Date of Patent: Dec. 31, 2013

(54) METHOD AND SYSTEM FOR PROVIDING SPREAD SCRAMBLED CODED MULTIPLE ACCESS (SSCMA)

(75) Inventors: Russell Fang, Potomac, MD (US); Mustafa Eroz, Germantown, MD (US); Neal Becker, Frederick, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 536 days.

(21) Appl. No.: 12/647,096

(22) Filed: Dec. 24, 2009

(65) Prior Publication Data

US 2010/0098245 A1  Apr. 22, 2010

Related U.S. Application Data

(63) Continuation-in-part of application No. 12/056,144, filed on Mar. 26, 2008, now abandoned.

(60) Provisional application No. 60/908,340, filed on Mar. 27, 2007.

(51) Int. Cl.
    *H04L 29/06* (2006.01)
(52) U.S. Cl.
    USPC .......................................... 380/28; 713/162
(58) Field of Classification Search
    USPC ............................................ 380/28; 714/786
    See application file for complete search history.

(56) References Cited

U.S. PATENT DOCUMENTS

| | | | |
|---|---|---|---|
| 6,023,783 A * | 2/2000 | Divsalar et al. | 714/792 |
| 6,430,722 B1 | 8/2002 | Eroz et al. | |
| 6,529,495 B1 | 3/2003 | Aazhang et al. | |
| 6,724,813 B1 * | 4/2004 | Jamal et al. | 375/219 |
| 6,940,827 B2 * | 9/2005 | Li et al. | 370/278 |
| 7,191,378 B2 | 3/2007 | Eroz et al. | |
| 7,424,662 B2 | 9/2008 | Eroz et al. | |
| 7,447,984 B2 | 11/2008 | Cameron et al. | |
| 7,746,758 B2 | 6/2010 | Stolpman | |
| 2003/0037298 A1 * | 2/2003 | Eleftheriou et al. | 714/752 |
| 2004/0054960 A1 | 3/2004 | Eroz et al. | |
| 2004/0258177 A1 | 12/2004 | Shen et al. | |
| 2006/0224935 A1 | 10/2006 | Cameron et al. | |
| 2008/0019263 A1 | 1/2008 | Stolpman | |
| 2009/0187804 A1 | 7/2009 | Shen et al. | |
| 2010/0100789 A1 | 4/2010 | Yu et al. | |
| 2011/0051825 A1 | 3/2011 | Tao et al. | |

OTHER PUBLICATIONS

Office Action for U.S. Appl. No. 12/686,171 dated Apr. 30, 2012, pp. 1-20.
Office Action for U.S. Appl. No. 12/056,144 dated Dec. 15, 2011, pp. 1-26.

* cited by examiner

*Primary Examiner* — Yogesh Paliwal
(74) *Attorney, Agent, or Firm* — Potomac Technology Law, LLC

(57) ABSTRACT

A spread scrambled multiple access (SSCMA) scheme is described. A first encoded bit stream of a first terminal is scrambled according to a first scrambling signature. A second encoded bit stream of a second terminal is scrambled according to a second scrambling signature. The first scrambled bit stream is spread to match a communication channel bandwidth. The second scrambled bit stream is spread to match the communication channel bandwidth.

8 Claims, 23 Drawing Sheets

METHOD AND SYSTEM FOR PROVIDING SPREAD SCRAMBLED CODED MULTIPLE ACCESS (SSCMA)

RELATED APPLICATIONS

This application is a continuation in part of U.S. patent application Ser. No. 12/056,144 filed Mar. 26, 2008, entitled "Method and System for Providing Scrambled Coded Multiple Access (SCMA)," which is related to, and claims the benefit of the earlier filing date under 35 U.S.C. §119(e) of, U.S. Provisional Patent Application Ser. No. 60/908,340 filed Mar. 27, 2007, entitled "Efficient VSAT Transmission Using Low-Rate Turbo Codes and Scrambled Coded Multiple Access (SCMA) Techniques"; the entireties of which are incorporated herein by reference.

BACKGROUND INFORMATION

Multiple access schemes are employed by modern radio systems to allow multiple users to share a limited amount of bandwidth, while maintaining acceptable system performance. Common multiple access schemes include Frequency Division Multiple Access (FDMA), Time Division Multiple Access (TDMA), and Code Division Multiple Access (CDMA). System performance is also aided by error control codes. Nearly all communication system relies on some form of error control for managing errors that may occur due to noise and other factors during transmission of information through a communication channel. These communications systems can include satellite systems, fiber-optic systems, cellular systems, and radio and television broadcasting systems. Efficient error control schemes implemented at the transmitting end of these communications systems have the capacity to enable the transmission of data including audio, video, text, etc. with very low error rates within a given signal-to-noise ratio (SNR) environment. Powerful error control schemes also enable a communication system to achieve target error performance rates in environments with very low SNR, such as in satellite and other wireless systems where noise is prevalent and high levels of transmission power are costly, if even feasible.

Thus, broad classes of powerful error control schemes that enable reliable transmission of information have emerged including convolutional codes, low density parity check (LDPC) codes, and turbo codes. Both LDPC codes as well as some classes of turbo codes have been successfully demonstrated to approach near the theoretical bound (i.e., Shannon limit). Although long constraint length convolutional codes can also approach the Shannon limit, decoder design complexity prevents practical, wide spread adoption. LDPC codes and turbo codes, on the other hand, can achieve low error rates with lower complexity decoders. Consequently, these codes have garnered significant attention.

For example, conventional data transmission to and from an ultra small terminal via satellite is usually based on Code Division Multiple Access (CDMA) technique using rate 1/2 or 1/3 turbo codes. CDMA spreads bandwidth to reduce the interference to adjacent satellites, whereas the turbo code provides coding gain needed to close the link. CDMA also allows multiple users sharing the bandwidth at the same time. However, CDMA systems typically need a large bandwidth expansion factor to function properly. Additionally, CDMA systems require all signals accessing the same spectrum at the same time to be of equal power; provision for power control makes CDMA system more complicated to implement. The inherent long propagation delay of a satellite link makes it even more difficult. Moreover, based on different requirements and regulations that are set (for example, by Federal Communications Commission (FCC), International Radio Union), antenna side lobe, power density at antenna flange, off-axis effective isotropic radiate power (EIRP) density, etc. radiated by terminals that communicate via satellite are limited. However, to provide uplink closure at high data rates using small aperture antenna (for example, in small terminals), the regulatory limits can easily be exceeded by conventional satellite transmission means.

Based on the foregoing, there is a need for an access scheme that can effectively spread radiated power spectral density by, for example, utilizing low code rates and spectral spreading, while minimizing complexity.

SOME EXEMPLARY EMBODIMENTS

These and other needs are addressed by the present invention, wherein a spread scrambled division multiple access (SSDMA) scheme is provided.

According to one aspect of an exemplary embodiment, a method comprises scrambling a first encoded bit stream of a first terminal according to a first scrambling signature. The method also comprises scrambling a second encoded bit stream of a second terminal according to a second scrambling signature, wherein the first scrambling signature and the second scrambling signature are assigned, respectively, to the first terminal and the second terminal to provide a multiple access scheme. Further, the method comprises spreading the first scrambled bit stream to match a communication channel bandwidth; and spreading the second scrambled bit stream to match the communication channel bandwidth.

According to another aspect of an exemplary embodiment, an apparatus comprises a first scrambler configured to scramble a first encoded bit stream of a first terminal according to a first scrambling signature; and a second scrambler configured to scramble a second encoded bit stream of a second terminal according to a second scrambling signature, wherein the first scrambling signature and the second scrambling signature are assigned, respectively, to the first terminal and the second terminal to provide a multiple access scheme. The apparatus also comprises a first spreader configured to spread the first scrambled bit stream to match a communication channel bandwidth. The apparatus further comprises a second spreader configured to spread the second scrambled bit stream to match the communication channel bandwidth.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which.

DESCRIPTION OF PREFERRED EMBODIMENTS

A method, system, and software for providing a spread scrambled coded multiple access (SSCMA) scheme is described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Although certain embodiments of the present invention are described with respect to low-rate turbo codes, it is contemplated that these embodiments have applicability to low-rate codes in general (e.g., low density parity check (LDPC)).

Figure 1A:
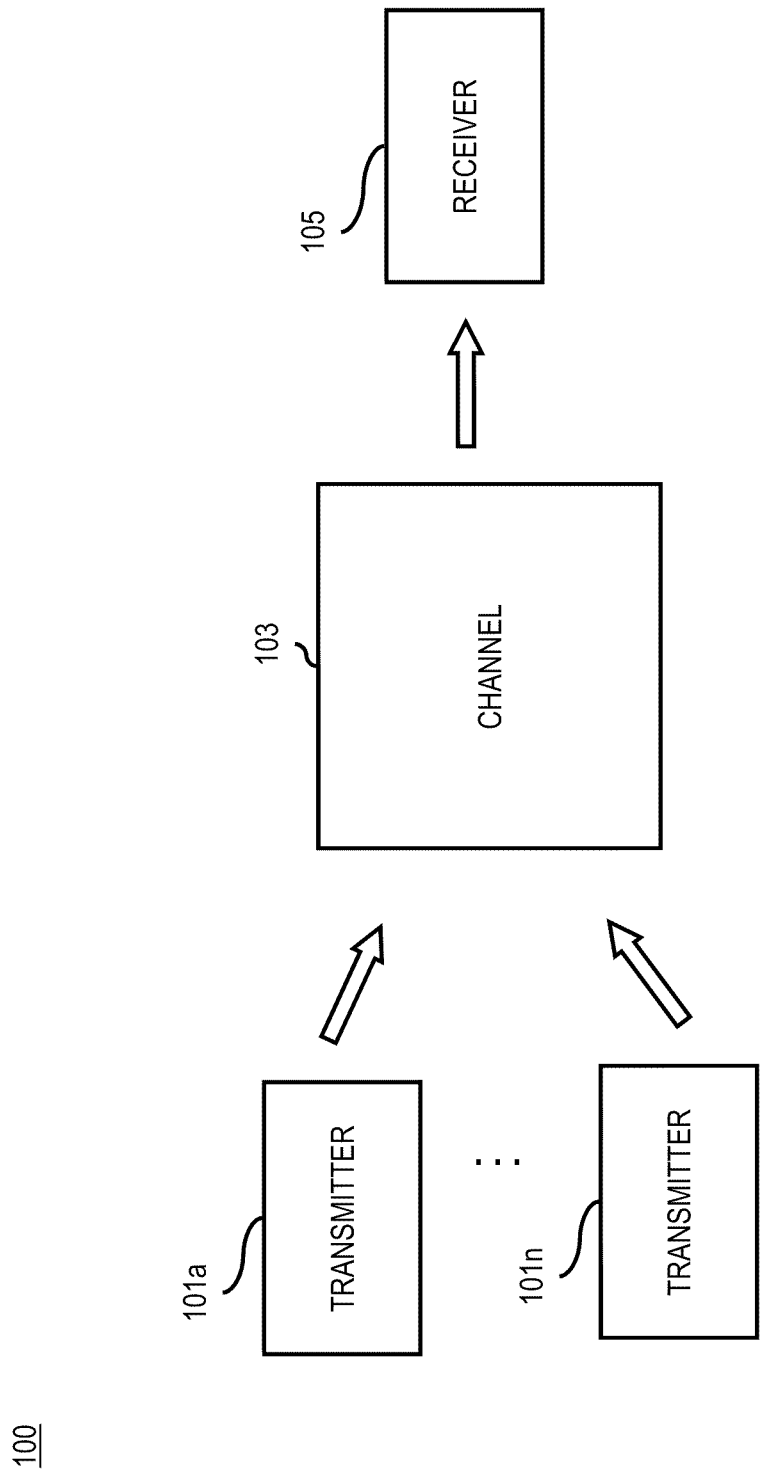
FIGS. 1A and 1B are communications systems capable of providing a spread scrambled division multiple access (SSDMA) scheme, according to various exemplary embodiments.
Figure 1B:
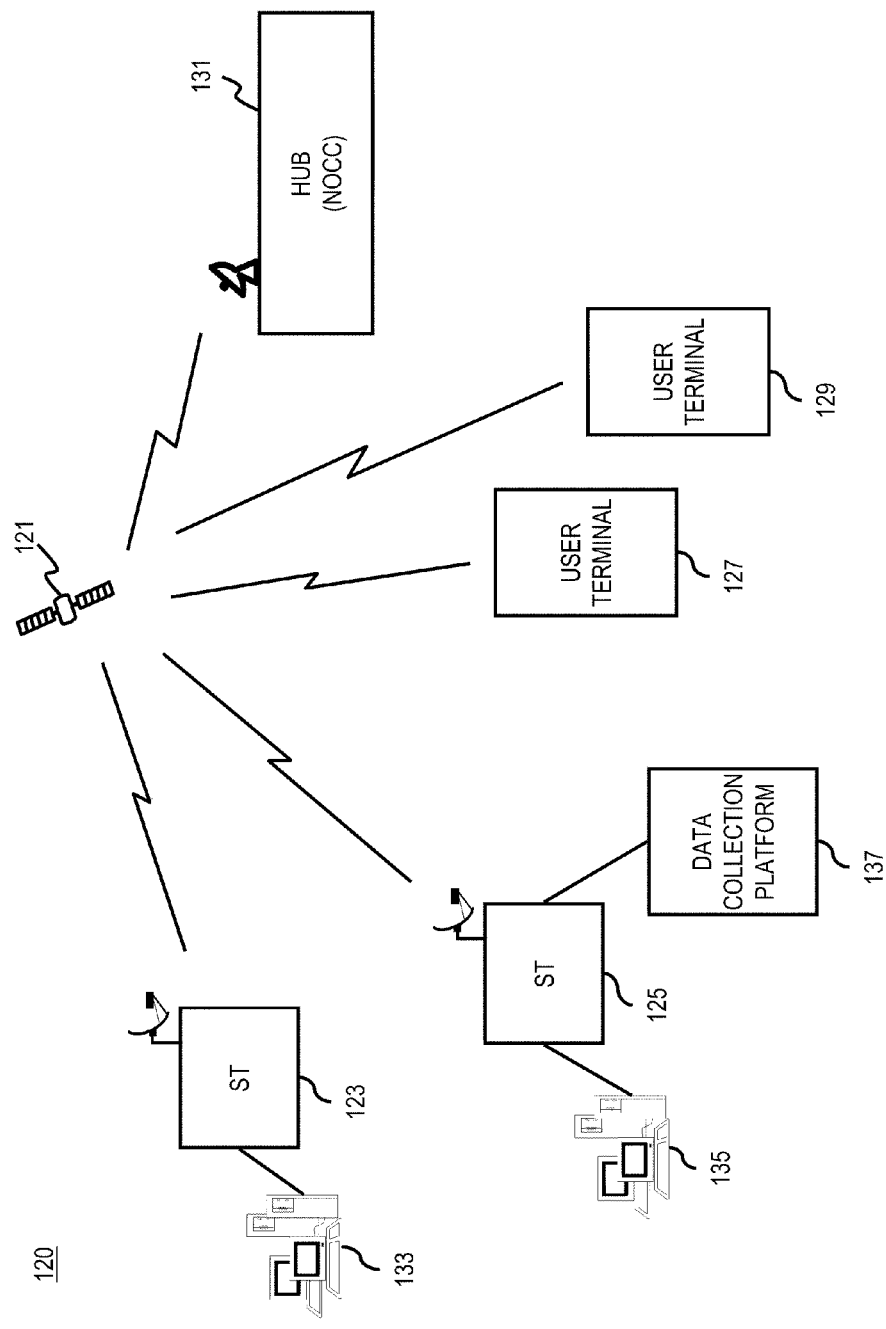

FIGS. 1A and 1B are communications systems capable of providing a spread scrambled coded multiple access (SSCMA) scheme, according to various exemplary embodiments. A digital communications system 100 includes one or more transmitters 101 that generate signal waveforms across a communication channel 103 to one or more receivers 105 (of which one is shown). In this discrete communications system 100, the transmitter 101 has a message source that produces a discrete set of possible messages; each of the possible messages has a corresponding signal waveform. These signal waveforms are attenuated, or otherwise altered, by communications channel 103.

According to certain embodiments, communication systems 100 and 120 of FIGS. 1A and 1B, which are capable of providing the SSCMA scheme, may be configured to support low power, long battery-life, and low duty-factor user terminals, data collection platforms, and/or supervisory control and data acquisition (SCADA) services. A variety of services may be provided by communication systems 100 and 120 that can include, but not limited to, (a) monitoring and reporting of utility meter readings for electricity, oil, gas, and/or chemical storage tanks; (b) monitoring and reporting of flow, temperature, pressure, leakage, corrosion, and/or cathodic protection for oil and gas pipelines; (c) monitoring and control of remote voltage regulators, capacitors, valves, compressors, and/or substations for chemical plants; (d) monitoring and tracking of vehicles, trucks, trailers, containers, cargos, barges, ships, trains, hazardous materials, and/or movements of special targets of interest (including personnel and wildlife); (e) diagnostic monitoring of the operating conditions of vehicles, tanker fleets, trailers, barges, and/or ships, including temperature alarms, open doors, full/empty conditions, engine hours, fuel levels, miles driven, and/or engine diagnostics, etc.; and (f) monitoring and reporting of meteorological and environmental data, including, but not limited to, air temperature, pressure, precipitation, and quality; water temperature, flow, and/or level; and readings of rain gauge, lightening and fire detectors, avalanche monitors, buoys, balloons, iceberg movements, etc.

Key characteristics of these types of services provided by communication systems 100 and 120 using SSCMA scheme can include low data rate (e.g., around 100s bps), low duty factor (a few times monthly, weekly, daily, and/or event driven), and geographically dispersed using unattended and battery operated user terminals. It is important to minimize cost and to maximize battery life of these user terminals as well as to maximize channel throughput in order to make these services economically viable.

Moreover, communication systems 100 and 120, by employing SSCMA scheme, can advantageously provide a frame for transmission of high speed data from user terminals to comply with any set requirements or regulations relating to, for example, mitigating off-axis EIRP density limit using, for example, spectral spreading of transmitted data. According to one exemplary embodiment, SSCMA can be employed for communication of user terminals over an existing C-, X-, Ku-, or Ka band transponder of a geosynchronous Fixed Service Satellite (FSS) satellite for, for example, satellite-on-the-move (SOTM) applications. Since significant amount of EIRP from terminals might be needed for uplink closure and user terminals can have small apertures, utilizing SSCMA scheme can moderate off-axis EIRP density to ensure no limits are exceed.

The SSCMA scheme employed by communication systems 110 and 120 can advantageously utilize scrambled coded multiple access scheme, low rate forward error correction (FEC) coding, and spectral spreading to achieve, at least, both power and bandwidth efficiency. Therefore, not only low power and long battery life user terminals can be used in providing viable data collection and SCADA services and channel throughput can be maximized, but also power density issues can be mitigated. In one exemplary embodiment, SSCMA scheme can be configured to spread the radiated power spectral density by a factor of F/R versus un-coded modulation waveform, where F is spreading factor and R is FEC code rate. Thus, if a low rate coding of R/F is used, whereby R is equal to 1/n, then the composite code rate would yield 1/(nF).

As noted, channel 103 of system 100 can be a noise channel. To combat this noise channel 103, coding is utilized. For example, forward error correction (FEC) codes can be employed. Forward error correction (FEC) is required in terrestrial and satellite systems to provide high quality communication over a radio frequency (RF) propagation channel, which induces signal waveform and spectrum distortions, including signal attenuation (freespace propagation loss) and multi-path induced fading. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, can result in significantly different system designs. Likewise, existing communication systems continue to evolve in order to satisfy increased system requirements for new higher rate or higher fidelity communication services.

Code rate is an important factor that has a significant effect on the error performance of the code. The choice of which code rate to operate, in turn, depends on the SNR of the environment in which the codes will be deployed. Typically, low SNR environments require the use of low code rates (i.e., more redundancy), whereas high SNR environments can enable the utilization of higher code rates. Hence, there is a continual challenge to devise codes that edge closer to the theoretical bound (i.e., Shannon limit), while minimizing complexity.

When considering turbo codes and LDPC codes, irregular LDPC codes can achieve superior performance over turbo codes for high code rates, whereas turbo codes have been demonstrated to be superior for lower code rates in low SNR environments. For very low codes such as 1/6 or lower, the coding industry has focused on classical turbo code design, which can, in essence, be improved. Because turbo codes have traditionally been designed to maximize the minimum Hamming weight of systematic codewords (where the information part of the codeword has a Hamming weight of two), it is recognized that further coding improvements can be made. At relatively high SNR, this approach yields good codes since two codewords are most easily confused when their information part is differed by two bits, owing to the recursive nature of their constituent codes.

However, for very low SNR where low code rates are traditionally used, an investigation of the erroneous turbo code frames reveals that the number of errors in the information part, is in general, more than two. This observation suggests that by targeting minimum Hamming weight corresponding to information sequences with Hamming weight more than two, the performance of low code rates, in principle, can be enhanced. With improved design, low rate turbo codes can approach the Shannon limit more closely, resulting in a variety of advantages for communication systems such as extended battery lifetime within cellular networks, lower transmit power within satellite communication and broadcasting systems, etc.

FIG. 1B is a diagram of an exemplary meshed network capable of supporting communication among terminals with varied capabilities, according to an embodiment.

Satellite communication system 120 includes a satellite 121 that supports communication among multiple satellite terminals (STs) 123, 125, user terminals (UTs) 127, 129, and hub 131. The hub 131 may assume the role of a Network Operations Control Center (NOCC), which controls the access of the terminals (such as STs and/or UTs 123, 125, 127, and/or 129) to the network 120 and also provides element management functions and control of the address resolution and resource management functionality. The satellite 121, in an exemplary embodiment, operates as a packet switch (e.g., at a data link layer) that provides direct unicast and multicast communication among the terminals (STs and/or UTs) 123, 125, 127, 129 and the hub 131. The STs 123, 125 may provide connectivity to one or more hosts 133 and 135, respectively.

According to an exemplary embodiment, one or more STs can support one or more data collection platforms and/or SCADA systems. As illustrated in the exemplary FIG. 1B, the ST 125 can support the data collection platform 137. Additionally or alternatively, the data collection platform 137 can operate independently from the ST 125. In certain embodiments, the terminals (STs and/or UTs 123, 125, 127, and/or 129) can be low power, long battery life, and low duty factor terminals, which can be geographically dispersed and can communicate based on low data rates and low duty factors. Further, the terminals (STs and/or UTs 123, 125, 127, and/or 129) can be fixed or mobile terminals. Also, the terminals (STs and/or UTs 123, 125, 127, and/or 129) may be transmit-only terminals and/or may have full duplex capabilities. In one example, the terminals (STs and/or UTs 123, 125, 127, and/or 129) may have global navigation satellite system (GNSS) (e.g., global positioning system (GPS)) receiving capabilities. Data transmission for transmit-only terminals can be triggered by an event (e.g., an event detected at a sensor) and/or be pre-scheduled at initial install, for example, using GPS time. Also, data transmission for duplex terminals can be triggered by an event, can be scheduled by configuration, and/or be commanded by the hub 131 on an as needed basis.

According to one embodiment, the system 120 can have a fully meshed architecture, whereby the terminals such as STs 123, 125 may directly communicate. A system in which terminals are deployed, particularly a satellite system, incompatibility problems may arise if different "generations" of terminals exist, in which one ST employs older hardware and/or software technologies than the other.

For newer, highly capable terminals to communicate with older (typically) less capable terminals, an exchange of information regarding the capabilities among the communicating terminals is needed. Specifically, the common air interface needs to support a discovery of the terminal's capabilities profile (or context information). These capabilities can include encryption scheme, compression scheme, segmentation and reassembly (SAR) scheme, automatic repeat request (ARQ) scheme, Quality-of-Service (QoS) parameters, power levels, modulation and coding schemes, power control algorithms, and link adaptation capabilities.

Under a conventional approach, terminal profile can be readily exchanged over a network with a star topology where no peer-to-peer communication exists. For example, in the General Packet Radio Service (GPRS)/Universal Mobile Telecommunications System (UMTS) family of protocols, such capabilities profiles include a packet data protocol (PDP) context and a mobility management context. In one embodiment of the present invention, the concepts of PDP context and mobility management context are combined and the term packet data protocol (PDP) context is used in general to refer to terminal capabilities. It is recognized that these terminals can be mobile as well as non-mobile. In an exemplary embodiment, this PDP context, for example, which can provide information about the encryption algorithm, compression algorithm, modes of data link layer communication, and physical layer transfer capabilities is combined by the transmit ST with the Quality of Service (QoS) of a pending data flow to determine a packet transfer context to use in transmission of the flow. If a PDP context has been previously established, then the sending ST can autonomously create the packet transfer context, which both satisfies the QoS of the data flow and is compatible with the receive ST capabilities.

According to one embodiment, the exchange of terminal profile can be executed over a meshed network, in a peer-to-peer manner. The STs 123 and 125 may support the use of a negotiation procedure to determine the optimal configuration for transmission and reception of data. If a protocol implements control procedures or options in newer versions (i.e., flow-control/rate-control), older protocol versions are able to detect the initiation as a new unsupported procedure and report the same to the peer with minimal disruption in the flow of traffic.

The ST-ST protocol advantageously takes into account that even for peers of the same version, some capabilities may not necessarily be always supported due to local temporal processing/memory/congestion-related constraints. Additionally, the ST-ST protocol design provides for rapid developments in data communication technology.

Incompatibility between two STs is detected by the terminal that originates the traffic. Thus, potential misconfigurations or software incompatibilities can at least be identified, without requiring communication at the service level of the more capable ST. For example, one of the STs 123 and 125 may need to be reconfigured in order to communicate with compression disabled in order to allow communication with an ST that does not support compression. It is noted that the capability is not necessarily a function of solely configuration or software compatibility, but may also be a function of current traffic load.

For each terminal (STs 123, 125, and/or UTs 127, 129) there exist some configuration information, including network configuration, network service provider (NSP) configuration, software configuration, and user configuration, as indicated by the NOCC 131. These configurations relate to the features that the terminals (STs and/or UTs 123, 125, 127, and/or 129 support and offer to the user, and have a direct bearing on the transmission and reception capabilities.

According to certain embodiments, to facilitate the flow of data from one peer ST 123 to another ST 125 of possibly different generations equipped with different capabilities, a packet transfer context is employed. Such a common feature set depends on the PDP contexts of the two STs 123 and 125; further, this common feature set may also depend on the QoS of the flow, as well as the loading and status of the two STs at that point of time. In an exemplary embodiment, the packet transfer context is unidirectional and valid only for the transmit ST to send packets to the specified receive ST; thus, the packet transfer context may be unique to a given pair of STs.

Figure 2A:
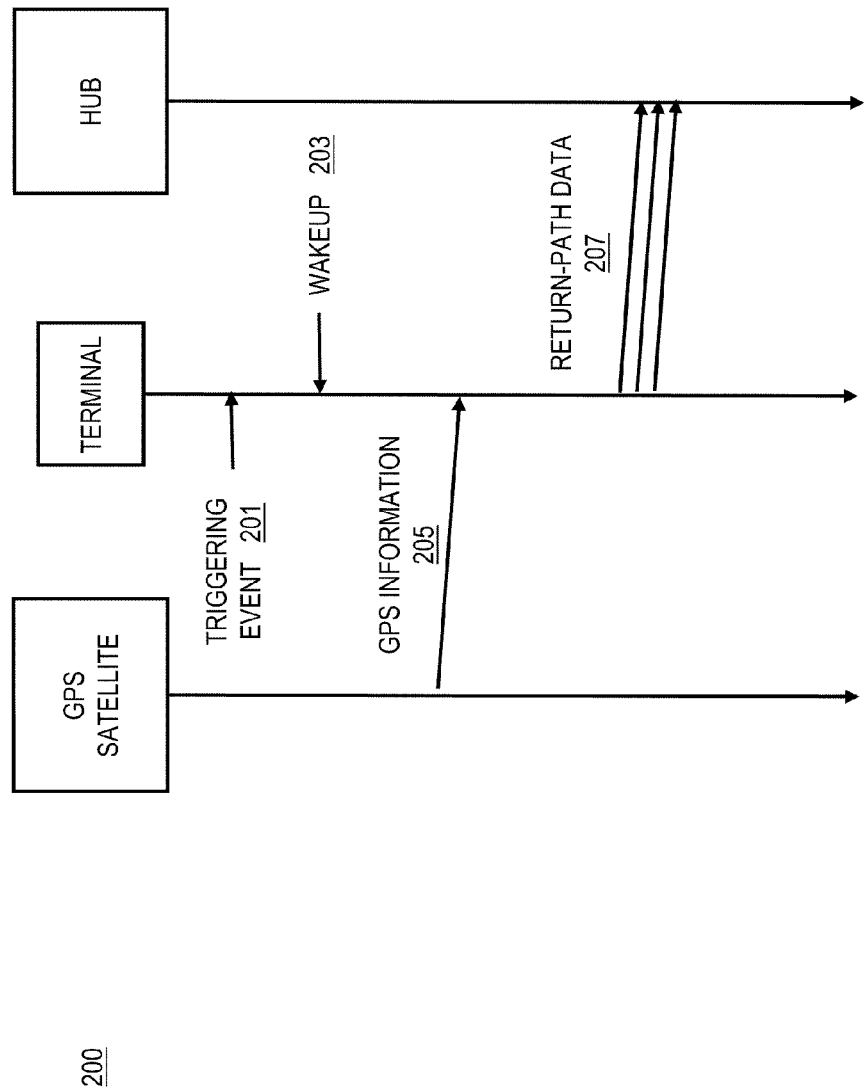
FIGS. 2A and 2B are ladder diagrams of processes for terminal data transmission, according to various exemplary embodiments.
Figure 2B:
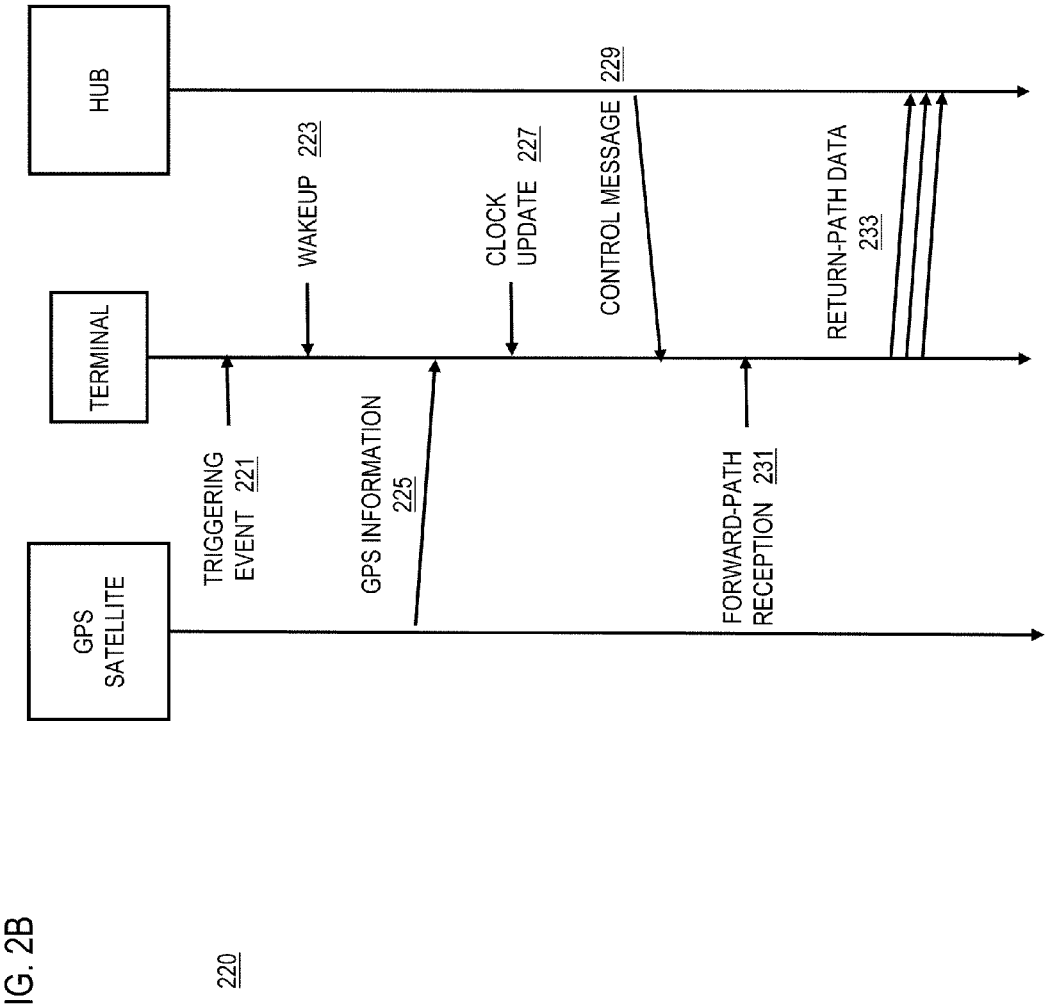

FIGS. 2A and 2B are ladder diagrams of processes for terminal data transmission, according to various exemplary embodiments. FIG. 2A illustrates concept of operation for a simplex terminal (such as one or more of ST and/or UT 123, 125, 127, and/or 129). In one exemplary embodiment, the terminal is in a sleep mode (or "inactive" state). A triggering event 201 occurs. The triggering event can include, but not limited to, a triggering event generated by a sensor and/or an event pre-scheduled at initial install of the terminal. However, it is contemplated that other triggering events can be used. The terminal exits the sleep mode at step 203 based on the triggering event 201 and can receive the GPS information 205 from a GPS satellite. As noted before, GPS satellite is used as an example, however, any global navigation satellite system can be employed. The terminal can use the received GPS information to, for example, discipline its oscillator(s), update its clock timing, warm up its electronics, etc. Further, the terminal can transmit its transmission data (such as sensor collected data) to, for example, hub 131 through the satellite 121 of FIG. 1B. In this exemplary embodiment, the communication path from the terminal (such as ST and/or UT 123, 125, 127, and/or 129) to hub 131 through the satellite 121 of FIG. 1B can be called the return path.

FIG. 2B illustrates concept of operation for a full duplex terminal (such as one or more of ST and/or UT 123, 125, 127, and/or 129). As noted, in an exemplary embodiment, the terminal can be in sleep mode. A triggering event 221 can occur and the terminal can transition out from the sleep mode 223. Further, the terminal receives GPS information 225 from the GPS satellite and updates its clock, oscillator(s), etc. 227. The duplex terminal can receive control message(s) 229 from, for example, hub 131 through satellite 121 of FIG. 1B. In one exemplary embodiment, control message(s) 229 can include configuration information, including network configuration, network service provider (NSP) configuration, software configuration, user configuration, etc. The terminal can perform forward path reception including, but not limited to, Doppler tracking, phase and timing synchronization, demodulation, decoding, etc. Forward path can include communication path from, for example, hub 131 of FIG. 1B to the terminal through satellite 121.

After the control message(s) is received from, for example, hub 131 and the forward path reception 231 is performed, the terminal can transmit its transmission data (such as sensor collected data) to, for example, hub 131.

Figure 3:
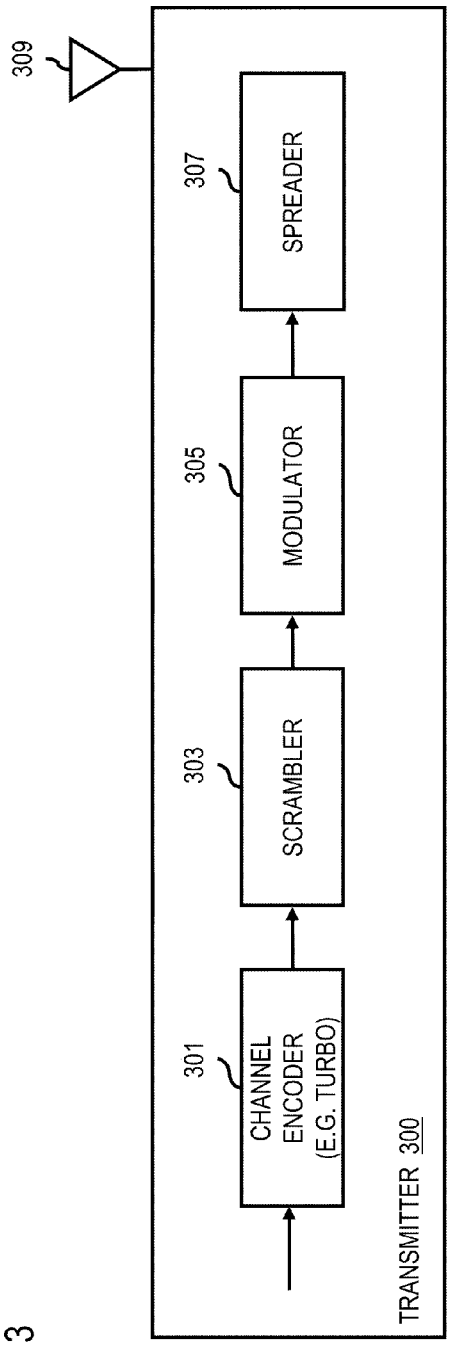
FIG. 3 is a diagram of a transmitter configured to operate in the systems of FIGS. 1A and 1B, according to an exemplary embodiment.

FIG. 3 is a diagram of a transmitter, according to an exemplary embodiment, configured to operate in the systems of FIGS. 1A and 1B. In one exemplary embodiment, transmitter 300 can be employed in a terminal (such as ST and/or UT 123, 125, 127, and/or 129). As noted, one key driver for success of data collection and/or SCADA services is hinged upon availability of terminals that are low cost and have long battery life.

Figure 4:
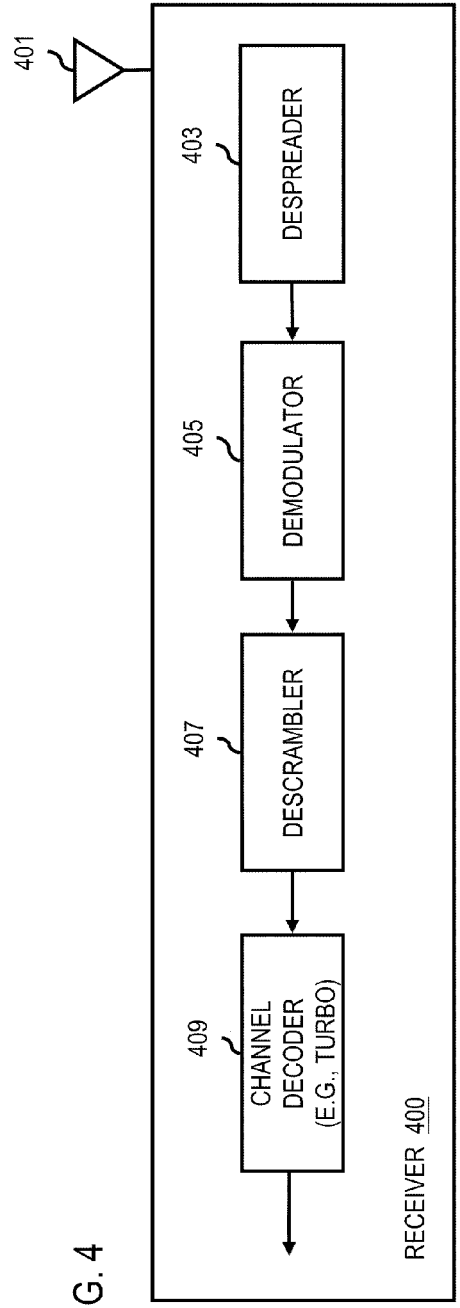
FIG. 4 is a diagram of a receiver configured to operate in the systems of FIGS. 1A and 1B, according to an exemplary embodiment.

As seen in FIG. 3, a transmitter 300 can be equipped with a channel encoder (e.g., turbo encoder, LDPC, etc.) 301 that accepts input from an information source and outputs coded stream of higher redundancy suitable for error correction processing at the receiver (as shown in FIG. 4). The information source generates k signals from a discrete alphabet, X. The channel encoder 301 may utilize a combination of a constituent encoder that uses one or more constituent codes and an interleaver to implement the channel coding procedure. Turbo codes are produced by parallel concatenation of two codes (e.g., convolutional codes) with an interleaver in between the encoders. Low rate turbo codes and/or LDPC codes can be used to minimize required energy-per-information bit over noise density (Eb/No) for achieving a desired packet error rate (PER).

Essentially, the encoder 301 generates signals from alphabet Y to a channel scrambler 303, which scrambles the alphabet. That is, the channel scrambler 303 pseudo-randomizes the code symbols. Terminals (and/or users of the terminals) can be distinguished by their distinct scrambler patterns. The scrambled signals are fed to a modulator 305, which maps the encoded messages from encoder 301 to modulated signal waveforms that are fed to a spreader 307. In one exemplary embodiment, constant envelope Quadrature Phase Shift Keying (QPSK) modulation can be used that can allow saturation radio frequency amplification without loosing power efficiency. However, it is contemplated that other modulation schemes can also be employed by the modulator 305.

The spreader 307 can match the modulated signal waveforms to a given channel bandwidth by spectral spreading by a factor of F (e.g., F=4, 16, etc.). According to certain embodiments, the spreader 307 expands the modulated signal waveform to match a channel bandwidth of 31.25X kHz. The spread modulated signal waveform is further transmitted to a transmit antenna 307.

The spreader 307 can employ spread spectrum techniques in order to spread, in frequency domain, energy and/or power generated in a particular bandwidth to result a signal with a wider bandwidth. Spectral spreading can result in limiting power flux density, a secure communication link, preventing detection, resistance to interference and/or jamming, etc. Spreader 307 can employ frequency hopping, direct sequence, or a hybrid of these to spread the modulated signal waveform. However, other spreading techniques such as time-hopping spread spectrum (THSS) and/or chirp spread spectrum (CSS) can be employed.

The antenna 309 emits these waveforms over the communication channel 103. Accordingly, the encoded messages are scrambled, modulated, spread, and distributed to a transmit antenna 309. The transmissions from the transmit antenna 309 propagate to a receiver, as discussed with respect to FIG. 4.

In addition to the above-noted components, transmitter 300 can include additional modules. For example, transmitter 300 can insert properly designed unique words (UW) symbols and pilot symbols to ensure burst synchronization at low energy per chip over noise density (Ec/No). Therefore, the transmitted signals can be distinguished based on their distinct scrambler patterns and UW symbols. UW symbols can be employed to facilitate burst and symbol timing synchronization. Also, pilot symbols, which can be inserted evenly across a packet payload, can be employed to assist carrier phase synchronization under low available Eb/No. In one exemplary embodiment, associated with the spreading factor F, a factor of F longer UW symbol in terms of chips may be used in order to provide sufficient signal to noise for UW detection. Also, additional electronic serial number (ESN) can be included in the transmitted signal for identification purposes. (Specific UW symbols of good auto and cross correlation properties can be generated by using the method proposed by A. Roger Hammons, Jr. and P. Vijay Kumar, "On a Recent 4-Phase Sequence Design for CDMA," IEEE Trans. on Comm. Vol. E76-B, No. 8, August 1993, pp. 804-813, which is incorporated in its entirety).

According to one exemplary embodiment, hub 131 of FIG. 1B can transmit waveform signals (that can include, for example, SCADA signal) over each beam at the same frequency channel (for example 31.25X kHz channel) for duplex terminals. This can eliminate requirement of having frequency synthesizer in each terminal. Individual burst can be employed for different terminals, since respective channel conditions may vary and forward path power control may be employed to minimize required satellite power. Additionally or alternatively, different UW symbols may be employed for different surrounding beam consistent with beam frequency reuse pattern in order to mitigate effects of co-channel interference (CCI) in UW detection and also to minimize false detection probability. In one example, UW identification to beam assignment can be fixed and can be configured during initial install of a terminal (for example, based on GPS position), however, it may be changed as it traverses to another beam. UW symbols can be used to facilitate synchronizations at a receiving terminal. Additionally, hub 131 of FIG. 1B can insert pilot symbols in transmitted waveform signals to assist carrier phase synchronization.

Additionally, for example, for hub 131, M-times data repetition (e.g., M=3) can be employed to ensure link closure for some terminals located in some adverse channel environments. According to certain embodiment, transmitter employed in hub 131 can include a multiplexer (not shown) in order to multiplex all forward path waveform signals. In one example, the multiplexer (not shown) can multiplex the forward path waveform signals in time division multiplex (TDM) for transmission over the channel at a nominal symbol rate. The multiplexed waveform signals are transmitted to terminals (such as ST and/or UT 123, 125, 127, and/or 129) through the forward path.

According to one embodiment, SSCMA provides a capability to realize synchronous and asynchronous multiplexing and multiple accessing by a multiplicity of user signals over a wireline, or wireless channel (e.g., including satellite links).

FIG. 4 is a diagram of a receiver configured to operate in the systems of FIGS. 1A and 1B. At the receiving side, a receiver 400 includes an antenna 401 that receives the waveforms emitted over the channel 103. The receiver 400 provides a de-spreader 403 that de-spreads the received signals. Further, the receiver 400 employs a demodulator 405 that performs demodulation of the de-spread received signals. After demodulation, the received signals are forwarded to a channel de-scrambler 407 to unscramble the symbols. A decoder 409 then attempts to reconstruct the original source messages.

It is contemplated that the above transmitter 300 and receiver 400 can be deployed in within a single wireless terminal, in which case a common antenna system can be shared. The wireless terminal can for example be configured to operate within a satellite communication, a cellular system, wireless local area network (WLAN), etc.

According to certain embodiments, receiver 400, which can be employed in a terminal (such as ST and/or UT 123, 125, 127, and/or 129), can include additional components and/or modules. For example, receiver 400 can be configured to examine a packet header of the received signal to determine whether the received signal is intended for this terminal. In this exemplary embodiment, received signals can be acquired and synchronized (for example, based on UW symbols and/or pilots symbols) in time, frequency, and carrier phase for demodulation. Further, a packet header of the received signal can be decoded to extract information on packet length, FEC code rate, destination terminal address, source hub, etc. If destination address matches with the receiving terminal's address, iterative decoding (as will be discussed later) of a payload of the received signal may be employed (using, for example, signal length and code rate as identified in the header). Otherwise, the terminal may skip the signal and wait for the next received signal. Therefore, terminals will not waste their limited battery power on processing unnecessary data.

Figure 5:
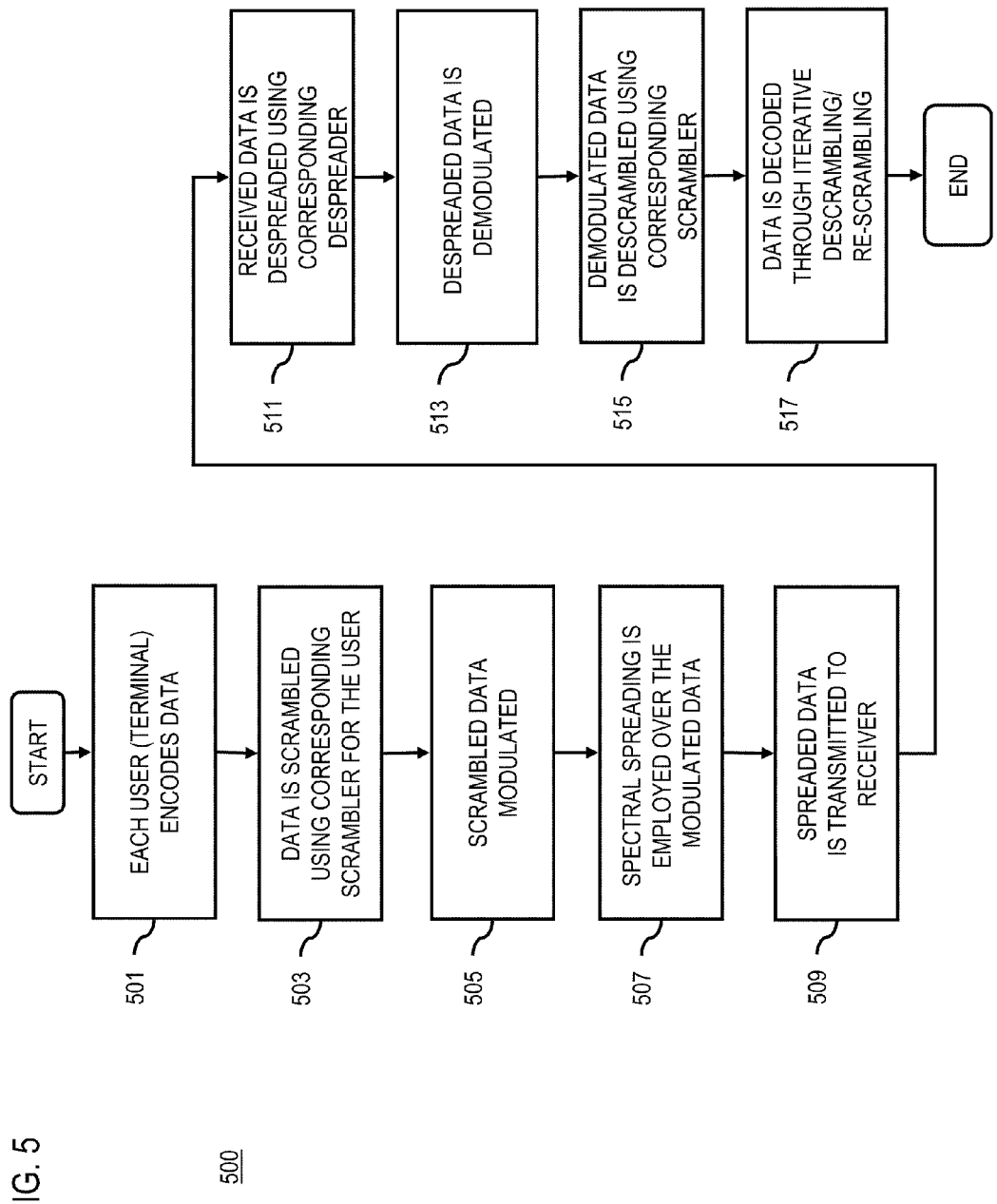
FIG. 5 is a flowchart of a process of transmission and reception using a SSCMA scheme employing low rate forward error correction (FEC) code, according to an exemplary embodiment.

FIG. 5 is a flowchart of a process of transmission and reception using a SSCMA scheme employing low rate FEC (such as low rate turbo codes, LDPC, etc.), according to an exemplary embodiment. In one embodiment, process 500 can be employed using transmitter 300 and receiver 400. Additionally or alternatively, process 500 can be performed by multiple transmitters, as explained later with respect to FIGS. 6 and 7.

In the exemplary embodiment of process 500, each terminal (if multiple terminals are employed) encodes data using corresponding encoder (e.g., 301 of FIG. 3), at step 501. At step 503, the encoded data is the scrambled using scrambler associated with the user (e.g., 303 of FIG. 3). The scrambled data is further modulated at step 505 and the modulated data is spread at step 507, for example, to match the modulated signal to a given channel bandwidth. At step 509, the spread signal is then transmitted to a receiver, such as receiver 400.

At steps 511 and 513, the received signal is first de-spread and demodulated. The demodulated signal is further de-scrambled at step 515. As will be discussed in more detail with respect to FIGS. 6 and 7, the received signal can undergo de-scrambling and re-scrambling in step 515. The de-scrambling and re-scrambling is performed in conjunction with the decoding process, which outputs decoded data (step 517).

Figure 6:
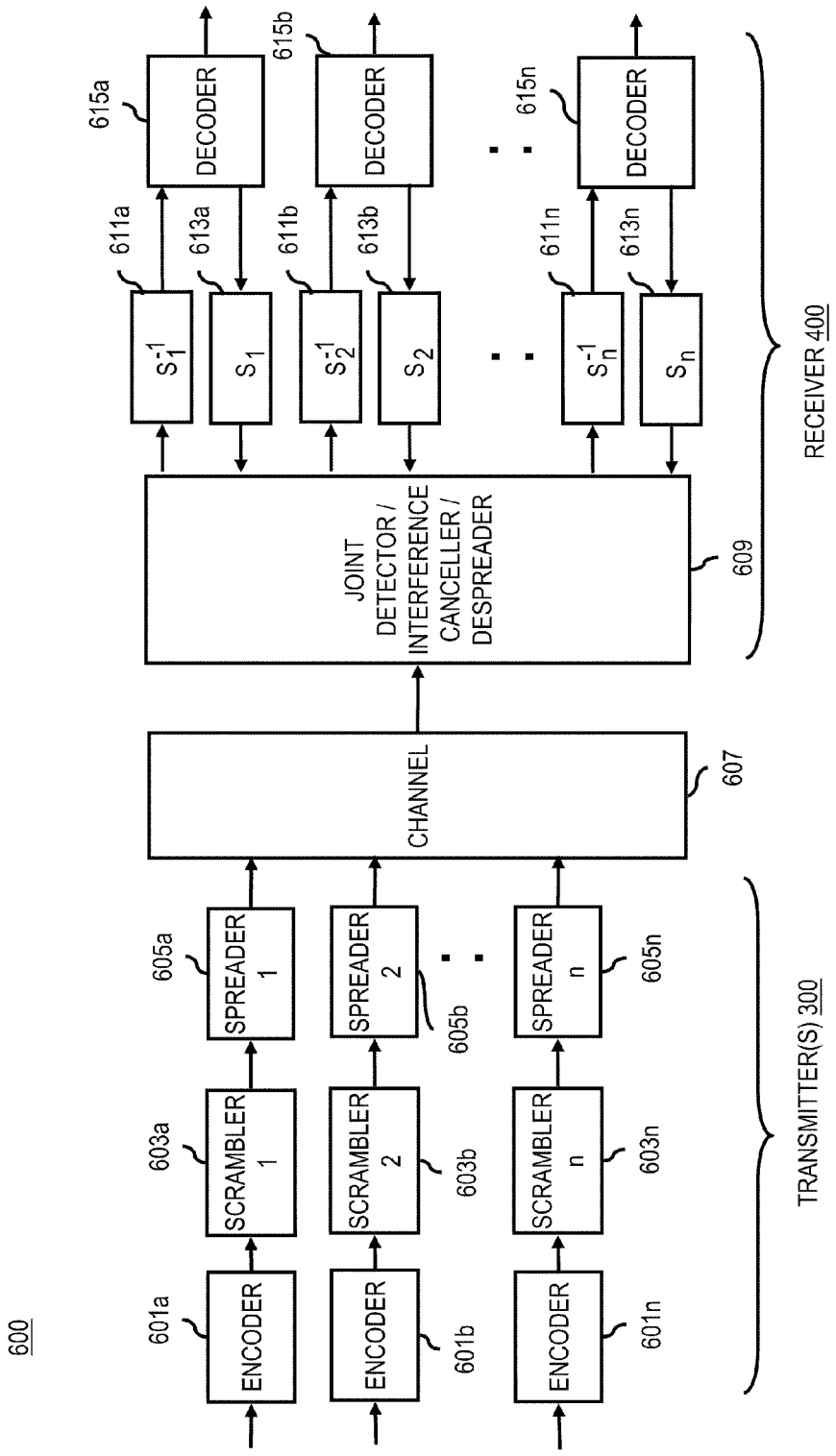
FIG. 6 is a diagram of a system capable of supporting multiple transmitters using a SSCMA scheme employing low rate FEC code, according to an exemplary embodiment.

FIG. 6 is a diagram of a system capable of supporting multiple transmitters using a SSCMA scheme employing low rate FEC, according to an exemplary embodiment. For the purposes of illustration, a communication system 600 supports multiple terminals (i.e., users) configured with respective encoders 601a-601n, scramblers 603a-603n, and spreaders 605a-605n. In an exemplary embodiment, these terminals can be the transmitter 300 and the receiver 400 of FIGS. 3 and 4, respectively, operating in the satellite system 120 of FIG. 1B, for example, employed in the return path (from terminals to the hub through satellite). In this exemplary embodiment, return path transmission may be performed by terminals (such as ST and/or UT 123, 125, 127, and/or 129) and the return path reception can be performed by hub 131.

By way of example, the system 600 provides a multiple access scheme, such as SSCMA, which achieves good performance with relatively lower receiver complexity compared to CDMA (as the number of users that share the same channel increases). With SSCMA, each user sharing the transmission channel is separated by user specific scramblers 603a-603n. Also, due to use of low rate encoding, additional coding gain can be achieved under SSCMA scheme.

By using low rate codes, the system 600 can achieve greater power efficiency while spreading the spectrum, whereas conventional CDMA does not. Moreover, by employing low rate codes in addition with spectrum-spread techniques by the SSCMA scheme, channel capacity over a given bandwidth subject to a total aggregate power limitation also far exceeds that of a CDMA. Additionally, SSCMA is different from another multiple access technique called Interleave-Division Multiple Access (IDMA), which also spreads with low-rate turbo-Hadamard codes but uses random interleavers as user signature. The low-rate turbo decoders, which can be used in some exemplary embodiments of SSCMA, are much more straightforward to implement since turbo-Hadamard codes require the decoding of Hadamard codes in addition to the decoding of turbo-like codes. Also, the same scrambler hardware can be utilized with different initial vectors (also known as "seed"), instead of different interleaver design. Further, using scrambling sequences as signatures is simpler than random interleaver-based signatures.

In one embodiment, encoders 601a-601n can include turbo encoders. In this exemplary embodiment, each of turbo encoders 601a-601n may utilize the same turbo codes. The turbo encoded sequences are then fed to the respective user-specific scramblers 603a-603n. The scrambled sequences are then modulated and fed to spreaders 605a-605n. Spreaders 605a-605n may perform spectral spreading on their respective modulated waveform signals to be expanded to match a channel bandwidth (for example, of 31.25X kHz). Waveform signals output of spreaders 605a-605n are then transmitted over channel 607 to a receiver, for example, receiver 400, which includes a joint detector/interference canceller/despreader unit 609 that interacts with the de-scramblers 611a-611n, scramblers 613a-613n, and decoders 615a-615n to iteratively produce an estimate of the received codewords. With each iteration, the turbo decoder 615a-615n produces a better estimate to the joint detector/interference canceller/despreader 609 for achieving better cancellation. The information exchanged between decoders 615a-615n and the joint detector/interference canceller/despreader 609 is scrambled or descrambled via scramblers 613a-613n or de-scramblers 611a-611n, respectively. Once "good" estimates of the decoded sequences are produced, they are output from the decoders 615a-615n.

In one exemplary embodiment, the receiver 400, as illustrated in FIG. 6, can include a ground based beam forming (GBBF—not shown), for example, before joint detector/interference canceller/despreader 609 for processing by beams and by channels. The desired output of the desired channel (for example, 31.25X kHz channel) can be further processed, as noted above. According to certain embodiments, joint detector/interference canceller/despreader 609 can, for each terminal, perform UW detection, chip timing recovery, de-spreading, carrier phase synchronization (for example, in presence of frequency error and multipath fades), etc.

Unlike conventional CDMA systems, joint detector/interference canceller/despreader 609 does not require all the signals accessing the same spectrum at the same time to be of equal power. In fact, the performance is better when the signals are of different power level. Thus, no tight power controls are needed. Also due to joint-detection/interference cancellation, the system 600 provides a scheme that is much more robust against Rician fading, which makes it particularly more attractive for small mobile terminals experiencing Rician multipath fading.

Therefore, the system 600, as a SSCMA system using low-rate FEC coding, requires less power to transmit data at the same speed vis-à-vis a CDMA system. In one embodiment, the system 600 can be operated in a random access manner and does not require reservation of time slots, which minimize delay to one satellite round trip. Additionally, the system 600, as mentioned, does not require tight power control, and thus, minimize the coordination needed between transmitter 300 and receiver 400. By way of example, potential applications can be for mobile or aeronautical terminals. It may also have applications to enable direct broadcast satellite (DBS) operators to provide return link over satellite via a commercial satellite using existing antenna systems.

Each terminal (or user) can encode its data with, for example, a rate 1/n FEC, where n is an integer larger than 3. The coded bits are then scrambled with a unique scrambling sequence, modulated, spread, and transmitted. Number of unique sequences is virtually unlimited with common sequence generators, such as the Gold sequences. The same generator can generate all the sequences, which are differentiated by the initial vector. It is noted that other low rates can be utilized, m/n (e.g., less than 1/3).

In an exemplary embodiment, the scrambling sequence can be generated by selecting a pseudorandom number sequence (e.g., Gold sequence) whose period is greater than the code block. On the receiver side, the respective terminal uses the corresponding demodulator, despreader, de-scrambler, and a rate 1/n decoder to retrieve its data. The signals are modulated by the same type of modulation, e.g., QPSK, of the same bandwidth, centered at the same frequency and transmitted at the same time (e.g., similar to CDMA). Typically, for receivers located in a hub of a star-shaped network, the antennas can be shared.

Figure 7A:
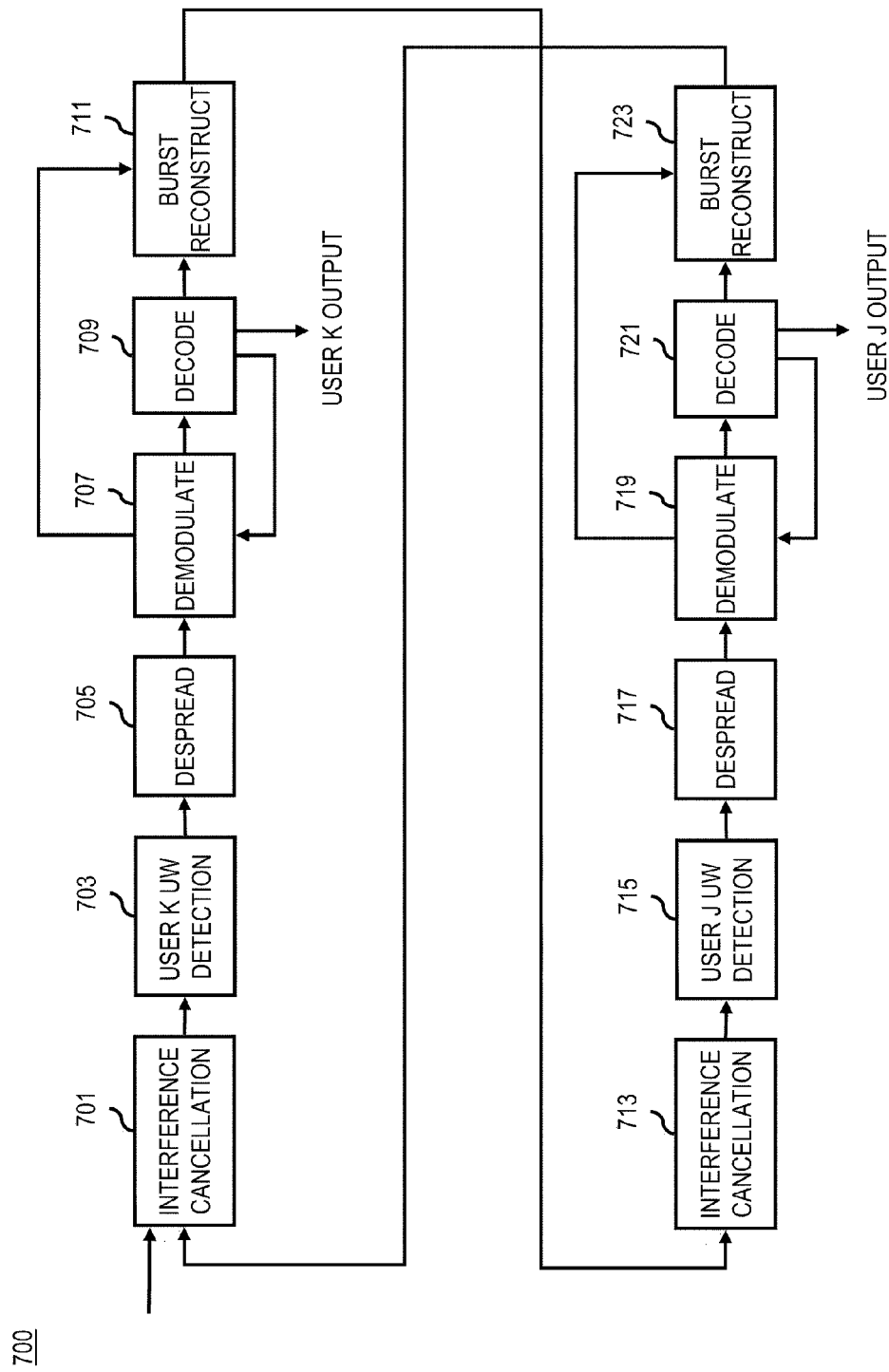
FIGS. 7A and 7B are, respectively, a functional diagram and a flowchart for joint detection/interference cancellation in the system of FIG. 6, according to an exemplary embodiment.
Figure 7B:
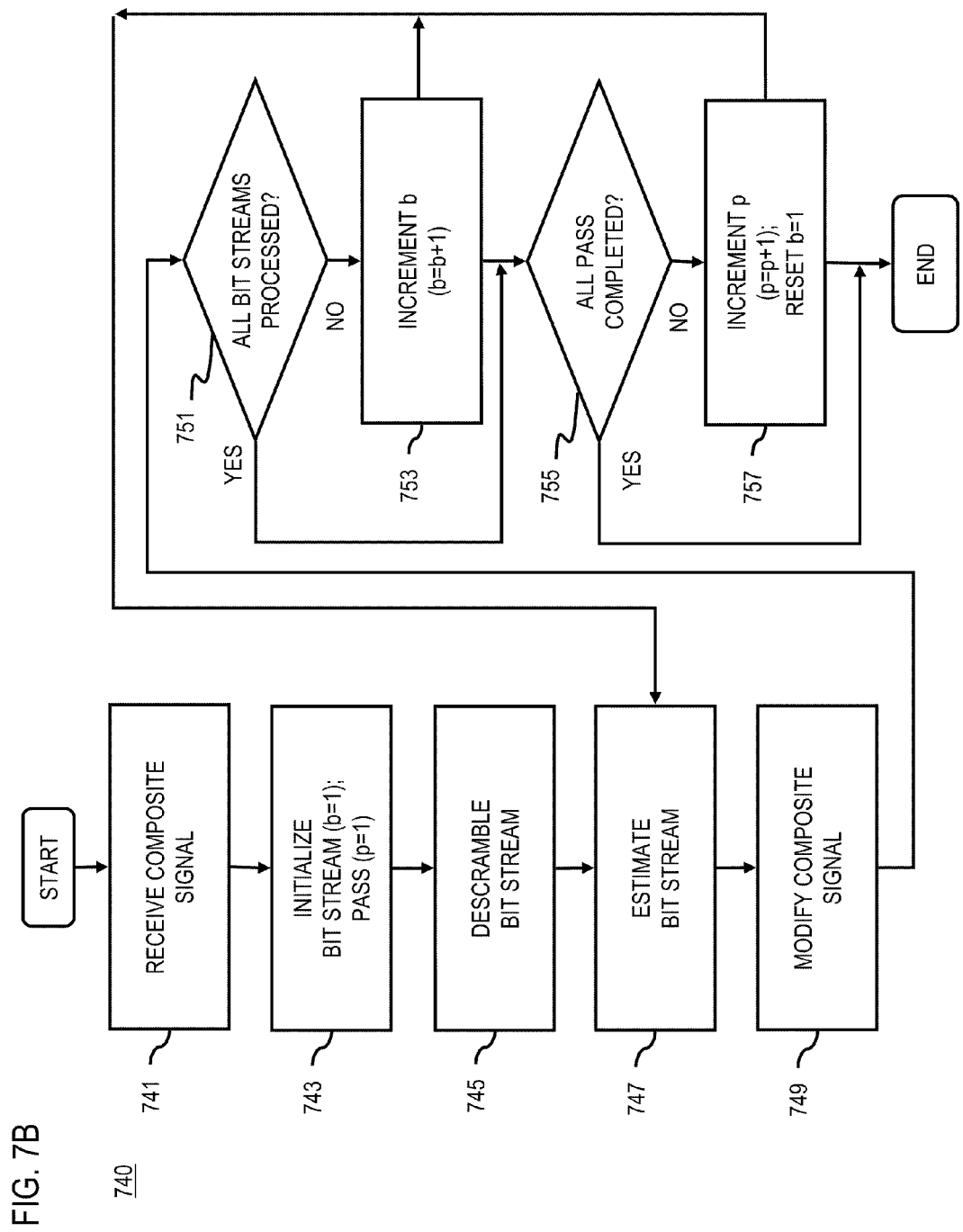

FIGS. 7A and 7B are, respectively, a functional diagram and a flowchart for joint detection/interference cancellation in the system of FIG. 6, according to an exemplary embodiment. A key enabler for this communication system 600 is the joint-detection/interference cancellation receiver. This receiver 400 includes the descramblers 611a-611n and the decoders 615a-615n as well as all the signal estimators and interference reducers for each of the individual signal paths.

In addition, the receiver 400 includes a buffer (not shown) to store a complete block of the composite signal. The receiver 400 employs joint detection/estimation; it is contemplated that any joint-detection/estimation technique may be used. In an exemplary embodiment, the receiver 400 operates iteratively to output the bit streams represented by the composite signal.

In one exemplary embodiment, the iterative functional diagram 700 receives the composite signal and cancels interferences at block 701. In one example, known interfering signals (e.g., bursts) are cancelled from the composite signal except the user signal of interest. In the exemplary embodiment of FIG. 7A, signal associated to user J may be cancelled from the composite signal at block 701. A cleaned up composite signal, for example without user J's signal, undergoes UW detection, at block 703. In one exemplary embodiment, the UW detection can be performed for a specific user (such as user K as illustrated). Additionally or alternatively, UW detection can include a correlation process to detect a strongest UW symbol in presence of user link Doppler, residual frequency errors, multipath fading, etc. Upon UW detection at block 703, chip timing recovery, de-spreading, carrier phase synchronization, demodulation, and decoding of the desired signal may be performed at steps 705-709. In one exemplary embodiment, decoding can include an iterative turbo decoding to the demodulated signal.

Next, at block 711, the decoded data is employed to re-encode, re-insert UW and pilot symbols, re-modulate, and re-spread to create a "cleaned-up" copy of the desired user signal. In the exemplary embodiment of FIG. 7A, the "cleaned up" copy of signal associated with user K can be input for interference cancellation block 713 for a similar process performed at steps 715-723 to create a "cleaned up" signal associated with user J. According to certain embodiments, the iterative process 700 can continue to create "cleaner" version of decoded data for each user. In one example, higher iteration of detection/estimation process can be carried out without UW detection but including minor timing adjustment signal timing estimate based on the finer symbol timing estimates. Such iterative process of 700 can repeat until all user signals are processed.

As noted, SSCMA algorithm is not sensitive to large disparity of user signal strength, unlike the conventional CDMA signal reception where large disparity of signal can result in strong self interference and induce undesirable near-far problem. In contrast, large signal disparity can improve the SSCMA detection performance due to the fact that stronger signal can result in better initial signal detection thereby yielding better interference cancellation. Therefore, unlike CDMA, no return path power control is required.

FIG. 7B illustrates a flowchart for joint detection/interference cancellation in the system of FIG. 6, according to another exemplary embodiment. As seen in FIG. 7B, in steps 741-747, once an entire block of composite waveform is de-spread, demodulated, sampled, and stored in the buffer, the receiver 400 first uses the first descrambler (e.g., descrambler 611a) and a decoder (e.g., decoder 615a) to estimate the first bit-stream. In one example, decoders 615a-615n can include turbo decoders. In step 749, the composite signal is modified accordingly. In this example, only one pass of the decoding is performed. The interference reducer then operates on the stored waveform given the result of the first pass decoding of the first signal. The receiver 400 then uses the second descrambler (e.g., descrambler 611b) and decoder (e.g., decoder 615b) to estimate the second bit-stream, and so on. When all the bit-streams have been estimated once (as determined in step 751), the receiver 400 than returns to process the first bit-stream in a second pass.

When all the bit-streams have been processed for the required number passes (steps 753-757), all the bit-streams are completely estimated and decoded.

Alternatively, in another embodiment, all the paths can be processed in-parallel for each pass; this approach may entail more passes than the above process.

Signal estimation, via a demodulator (not shown), plays an important role. In most applications of interest, this demodulator must operate at very low signal-to-noise plus interference ratio. In one embodiment, the demodulator is aided by two features: synchronization, and joint detection. The initial synchronization involves use of a known pilot, which can be introduced using anyone of the techniques known in the art. For example, known pilot symbols can be introduced by multiplexing them into the data stream, or pilot symbols may be introduced by puncturing the encoder output. Just as each encoder 601a-601n employs a different scrambling signature, each may employ a different pilot symbol pattern, thereby minimizing interference effects.

With respect to joint detection, this process involves iterative refinement of the demodulation. As the iteration progresses, the demodulation is improved through two techniques. First, as interference is removed, the estimation of signal parameters (e.g., frequency, symbol timing, carrier phase) is improved. Secondly, as more reliable estimates of the data symbols become available from the decoders 615a-615n, these are used to improve the demodulator performance.

In one embodiment, the signals are transmitted in a burst mode. Accordingly, the demodulator is configured to detect the burst arrival times by using, for example, a "Unique Word" pattern and/or symbol. It is recognized that any other well-known techniques may be used for this purpose. The Unique Word patterns of the various encoders may or may not be distinct.

Figure 8A:
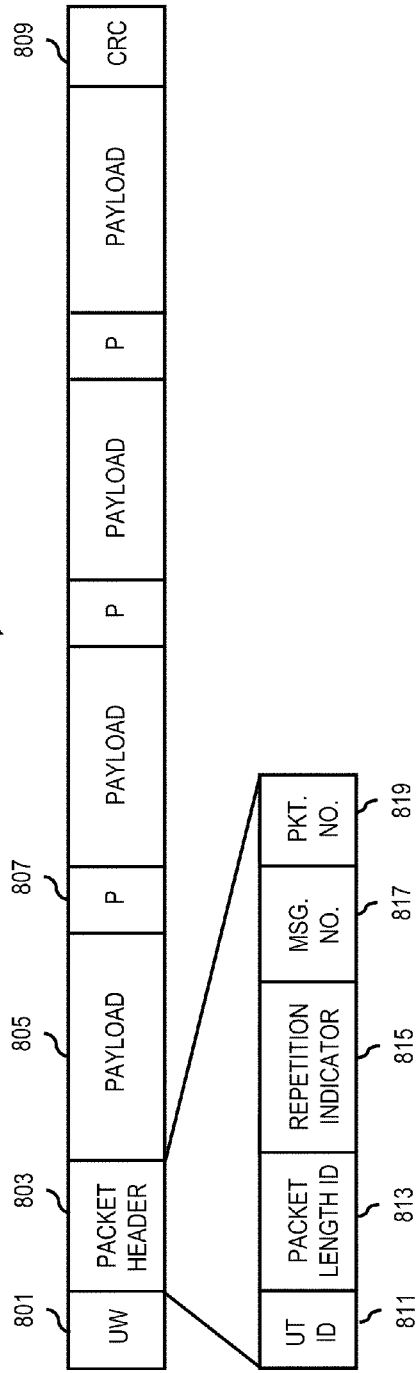
FIGS. 8A and 8B are, respectively, diagrams of burst format for return path transmission and forward path transmission, according to various exemplary embodiments.
Figure 8B:
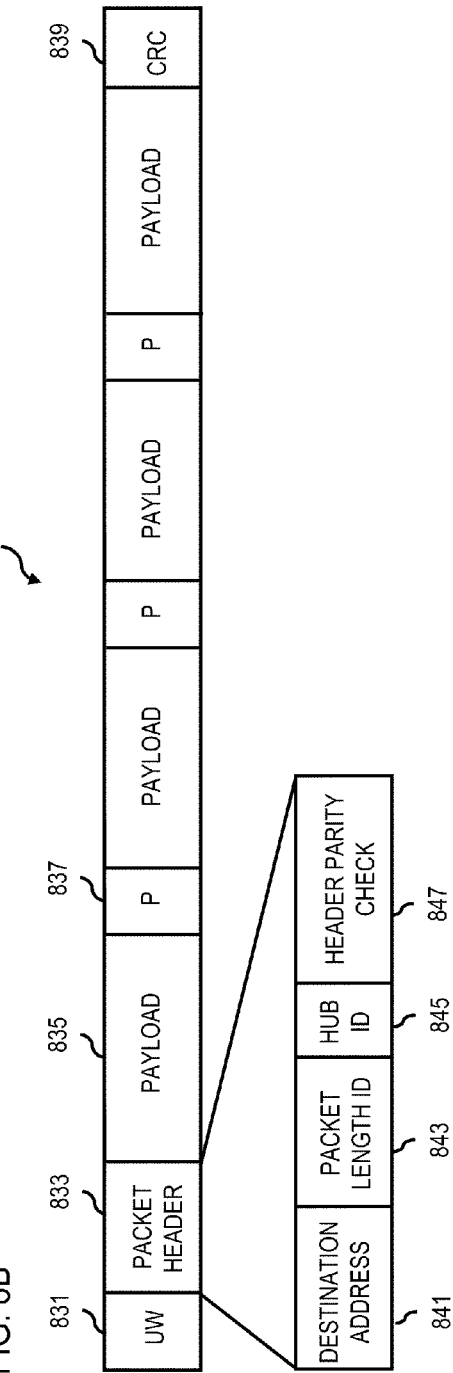

FIGS. 8A and 8B illustrate, respectively, burst format for return path transmission and forward path transmission, according to various exemplary embodiments. In one exemplary embodiment, the signals transmitted form terminals (such as ST and/or UT 123, 125, 127, and/or 129) to hub 131 in the return path can be in a burst mode with the format illustrated in FIG. 8A. The burst 800 can include a unique word pattern UW 801. UW 801 can assist timing synchronization and unique UW can be used to distinguish a terminal burst transmission. Further, burst 800 can include a packet heater 803. As illustrated in FIG. 8A, packet header 803 can include terminal identification (UT ID) 811, packet length ID 813, repetition indicator 815, message number (Msg. No.) 817, and packet number (Pkt. No.) 819.

In one exemplary embodiment, additional electronic serial number (ESN—in addition to UW and scrambler) may be included for as terminal identification 811 across satellite coverage. The nominal packet length 813 and data repetition indicator 815 can be configured at initial install of a terminal and/or be changed upon a command (for example, from hub 131), which is available for duplex terminals. In one exemplary embodiment, packet length 813 can demonstrate length of the packet or burst. Additionally, message number 817 and packet number 819 can be employed to indicate a message and an associated packet number within that message for hub 131 to differentiate within a given period of time, assuming all packet reception can be logged by the time of reception at hub 131.

Further, burst 800 can include payload 805, which can contain information (such as sensor data) that the terminal intends to transmit. In one exemplary embodiment, payload 805 can include encoded and/or scrambled data. Burst 800 can also include pilot symbol 807. In one exemplary embodiment, pilot symbols 807 are distributed evenly between payloads 805 and can ensure burst synchronization at low energy per chip over noise density (Ec/No). Also burst 800 can include a cyclic redundancy check (CRC) 809. CRC 809 can include an error detecting code to detect and/or correct accidental changes that might have occurred in burst 800, for example, during transmission. It is noted that any commonly used and standardized CRC can be used. Also, it is contemplated that any other error detecting codes and functions can be employed.

Further, according to one exemplary embodiment, for a terminal with receiving capability, a quality of service indicator of forward path as measured at the terminal can be incorporated in the return path payload to facilitate forward path power control at hub 131. Also, terminals can use their measured quality of service to adjust their uplink power for return path transmission unless hub 131 commands them to reduce their power.

FIG. 8B illustrates burst format for forward path transmission, according to an exemplary embodiment. In this exemplary embodiment, the signals transmitted form, for example, hub 131 to terminals (such as ST and/or UT 123, 125, 127, and/or 129) on a forward path (for example through the satellite 121) can be in a burst mode with the format illustrated in FIG. 8B. Burst 830 can include a unique word (UW) symbol 831 and a packet header 833. For illustration purposes, packet header 833 can include destination address 841, packet length ID 843, hub ID 845, and header parity check 847.

According to certain embodiments, destination address 841 can include a user terminal address for which burst 830 is transmitted. In one example, destination address 831 can include an electronic serial number (ESN) for identification. Packet length 843 and hub ID 845 can determine nominal length of burst 830 and identification (such as address) of the hub that is transmitting burst 830. Packet length 843 can be used to enable adequate iterative decoding. According to one exemplary embodiment, destination address 841, packet length 843, and hub ID 845 can be protected by a separate error correcting code such as header parity check 847. Although header parity check 847 is illustrated in FIG. 8B, it is contemplated that other error correcting codes such as forward error correcting codes can be employed. Using header error correcting code such as header parity check 847 prevents terminals from wasting their battery power on iterative decoding of bursts that are not destined to them.

Burst 830 can further include payload 835, pilot symbols 837 (that can be evenly distributed between payloads), and a CRC 839.

Figure 9:
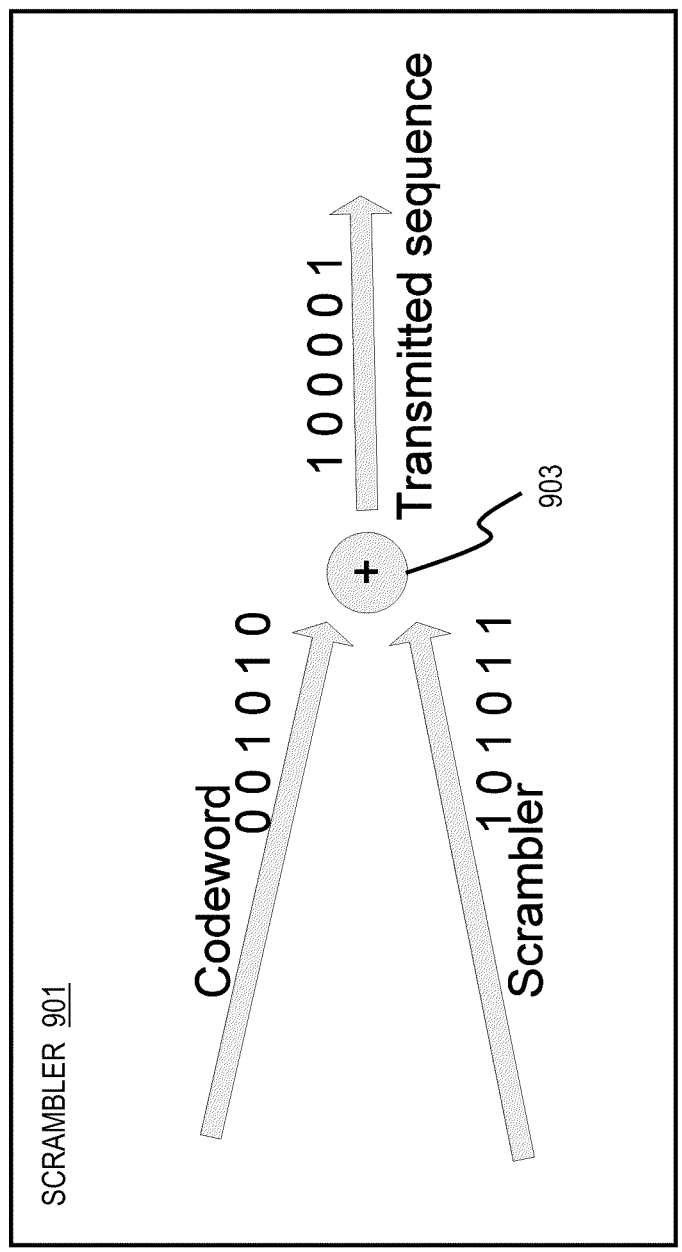
FIG. 9 is a diagram of a scrambler, according to an exemplary embodiment.

FIG. 9 is a diagram of a scrambler, in accordance with various exemplary embodiments. In this example, a scrambler 901 receives a codeword (e.g., "0 0 1 0 1 0") and a scrambling sequence (e.g., "1 0 1 0 1 1"). The scrambling sequence (or signature) can be a Gold sequence or any pseudorandom number sequence. Gold codes exhibit a number of characteristics. In addition to being simple to generate, these sequences contain roughly an equal number of zeros and ones, and are approximately orthogonal when delayed or shifted. Also, they are orthogonal to other codes. Gold sequences can be generated using feedback shift registers, whose outputs are added to produce the Gold codes. The codeword and scrambling sequence are combined by adder 903 to output a transmitted sequence (e.g., "1 0 0 0 0 1").

As mentioned, use of scramblers (as opposed to interleavers) reduces complexity. In a large system with numerous users, it is difficult to deploy a large number of interleavers that are prearranged between each pair of sender and receiver, whereas a common scrambler with different initial vector (also known as "seed") can be used for each pair of sender and receiver. Such arrangement is substantially easier to implement.

Figure 10:
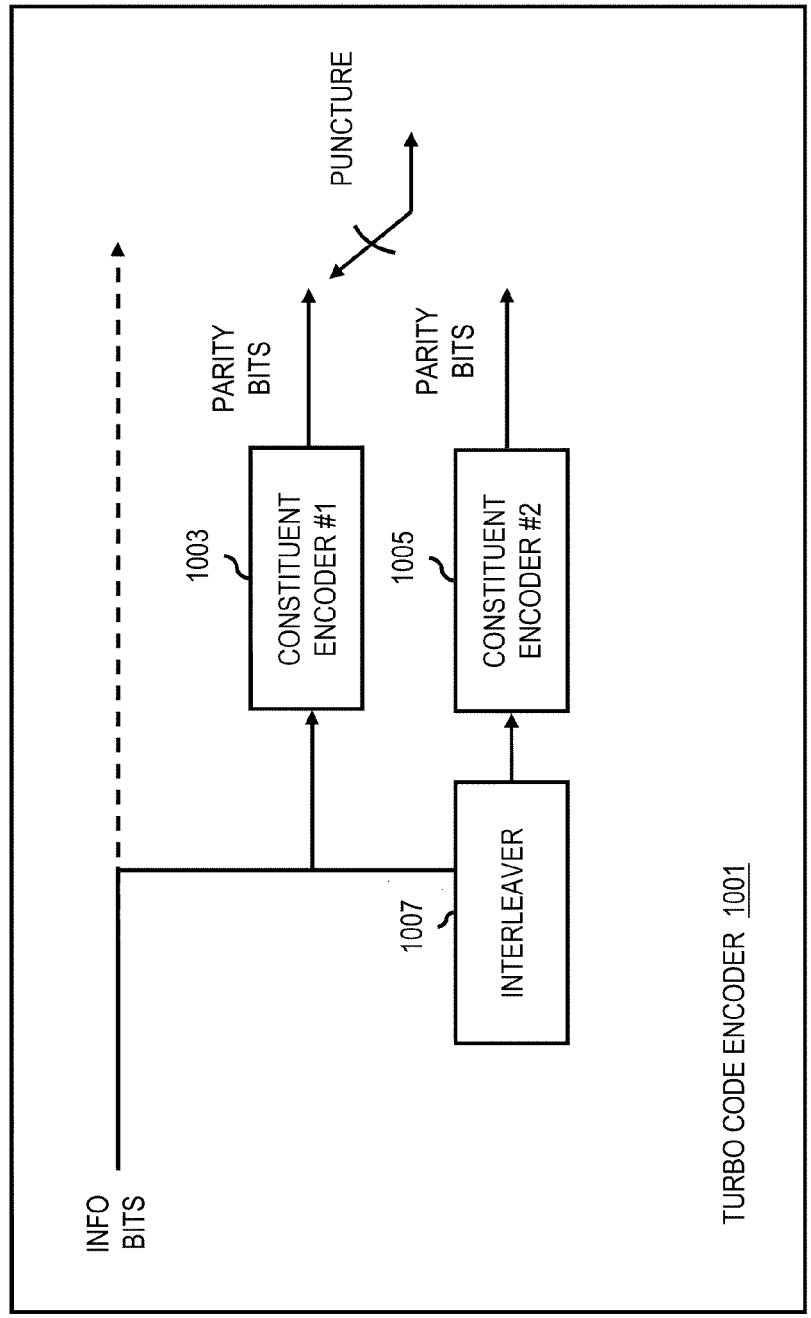
FIG. 10 is a diagram of a turbo code encoder configured to use constituent encoders, according to an exemplary embodiment.

FIG. 10 is a diagram of a turbo code encoder configured to use constituent encoders, in accordance with various exemplary embodiments. In this example, turbo encoder 1001 employs two constituent encoders 1003, 1005 and an interleaver 1007. In an embodiment, turbo encoder 1001 can be employed as encoder 301 of FIG. 3. Although two encoders 1003, 1005 are described in this scenario, the encoder 1001 can provide more than two encoders to achieve various code rates. As seen in FIG. 10, the turbo encoder 1001 can optionally output the information (i.e., systematic) bit as part of the output code, depending on the design of the constituent encoders 1003, 1005 and the code rates. The operation of the turbo code encoder 1001 is explained with respect to FIG. 11, as follows.

Figure 11:
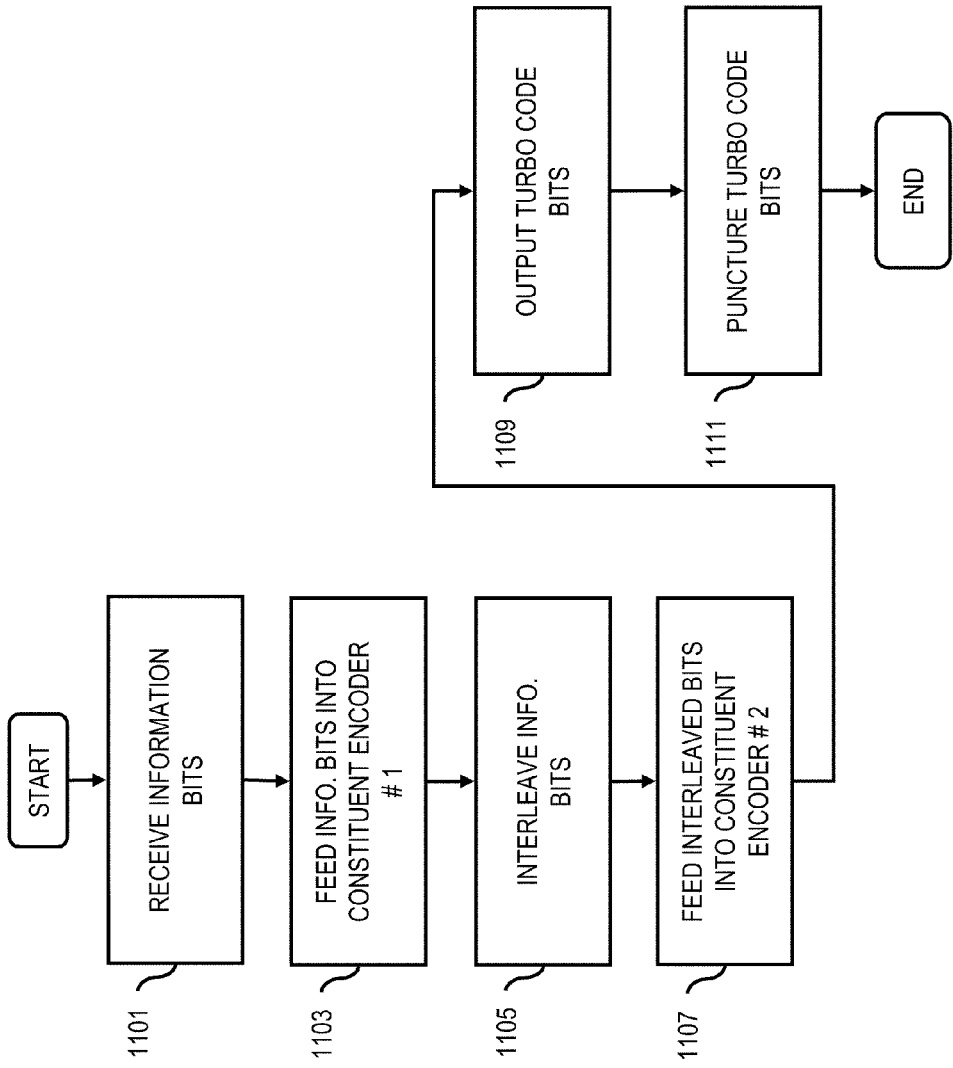
FIG. 11 is a flowchart of a process for turbo code encoding, according to an exemplary embodiment.

FIG. 11 is a flowchart of a process for turbo code encoding, according to an exemplary embodiment. Information bits that are to be turbo code encoded are fed to both constituent encoders 1003 and 1005 (step 1101). The bits that are fed to constituent encoder 1005 are, however, interleaved by interleaver 1007 prior to being input to constituent encoder 1005, as in steps 1103-1107. In steps 1109 and 1111, once both bit streams are encoded, the output of constituent encoders 1003, 1005 is punctured to achieve the desired code rate. According to an exemplary embodiment, the output of turbo encoder 1001 can contain the unpunctured bits at the output of constituent encoders 1003, 1005 and, alternatively, the information bits that have not undergone any processing, as illustrated in FIG. 10.

Figure 12:
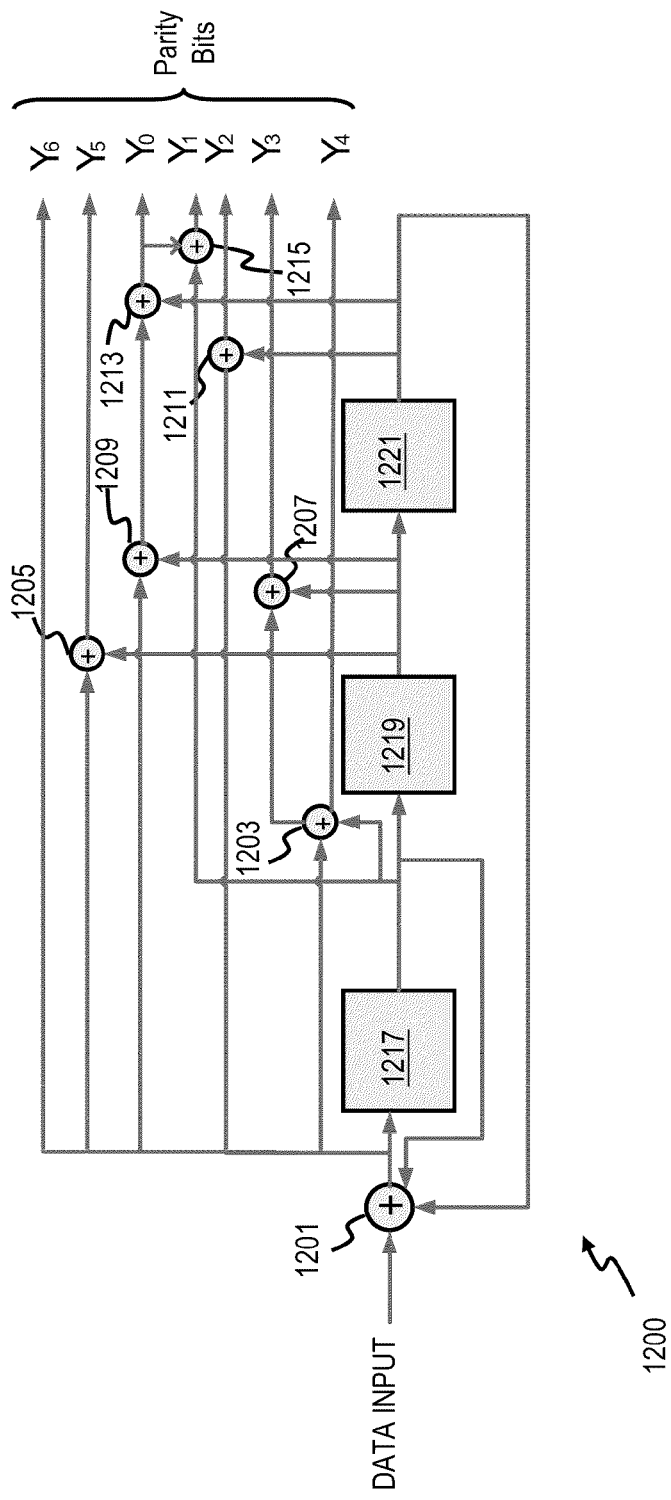
FIGS. 12 and 13 are diagrams of constituent encoders configured to provide low rate turbo codes, according to various exemplary embodiments.
Figure 13:
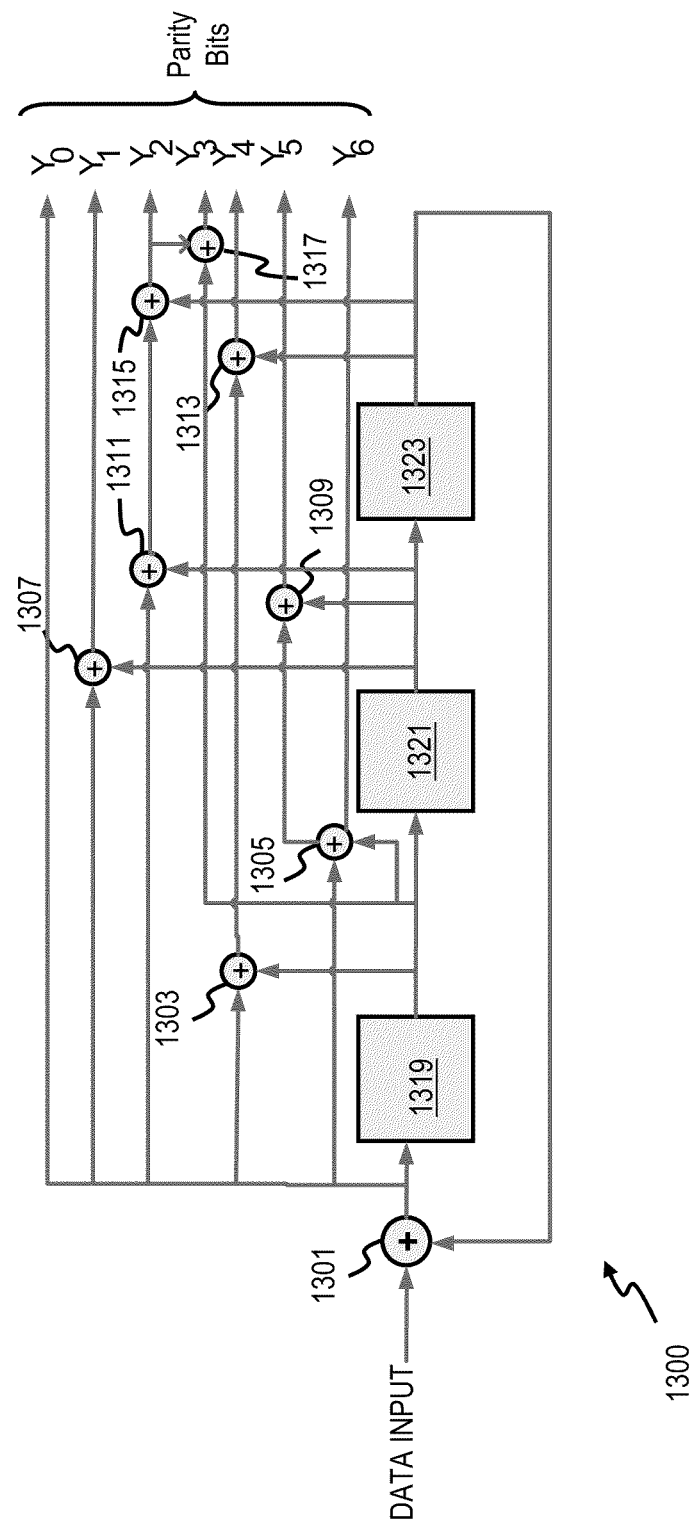
Figure 14A:
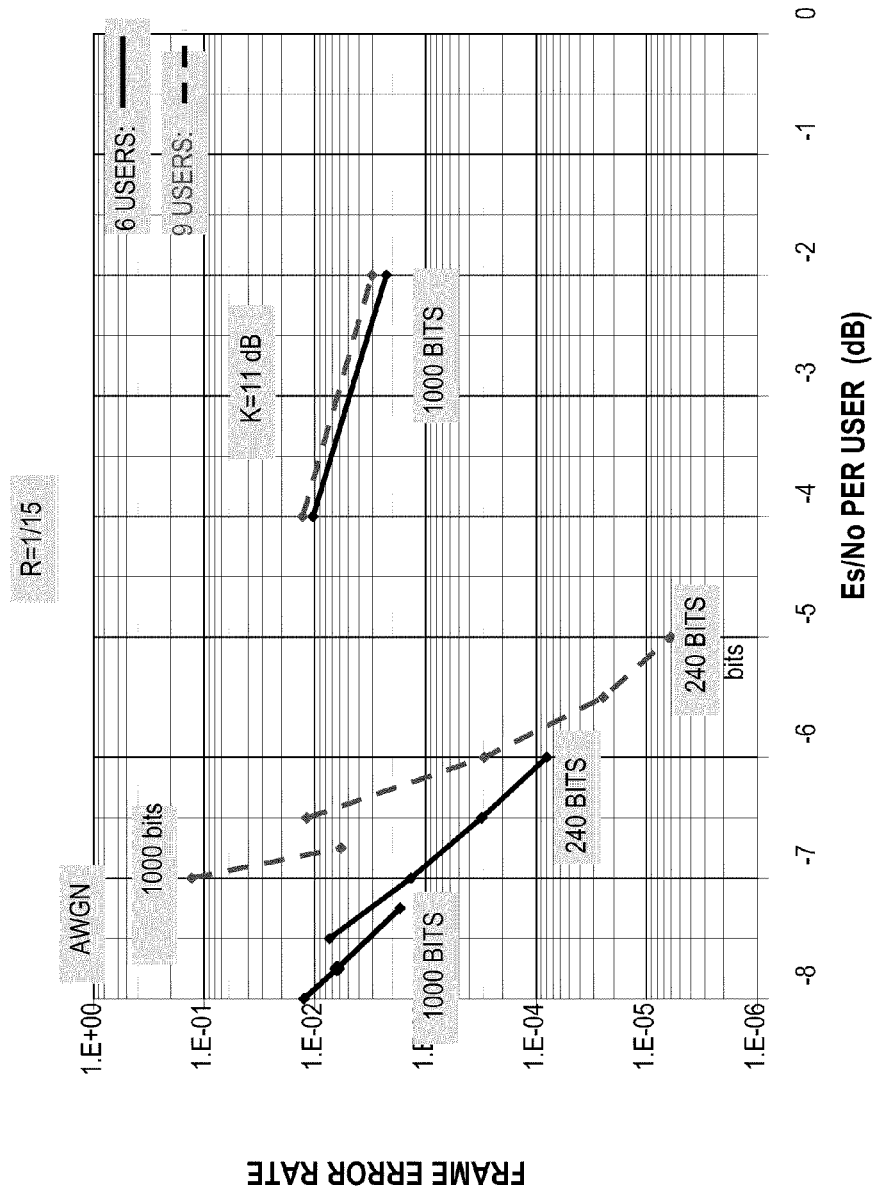
FIGS. 14A-14H are graphs illustrating the performance of the SSDMA system of FIG. 6, according to various exemplary embodiments.
Figure 14B:
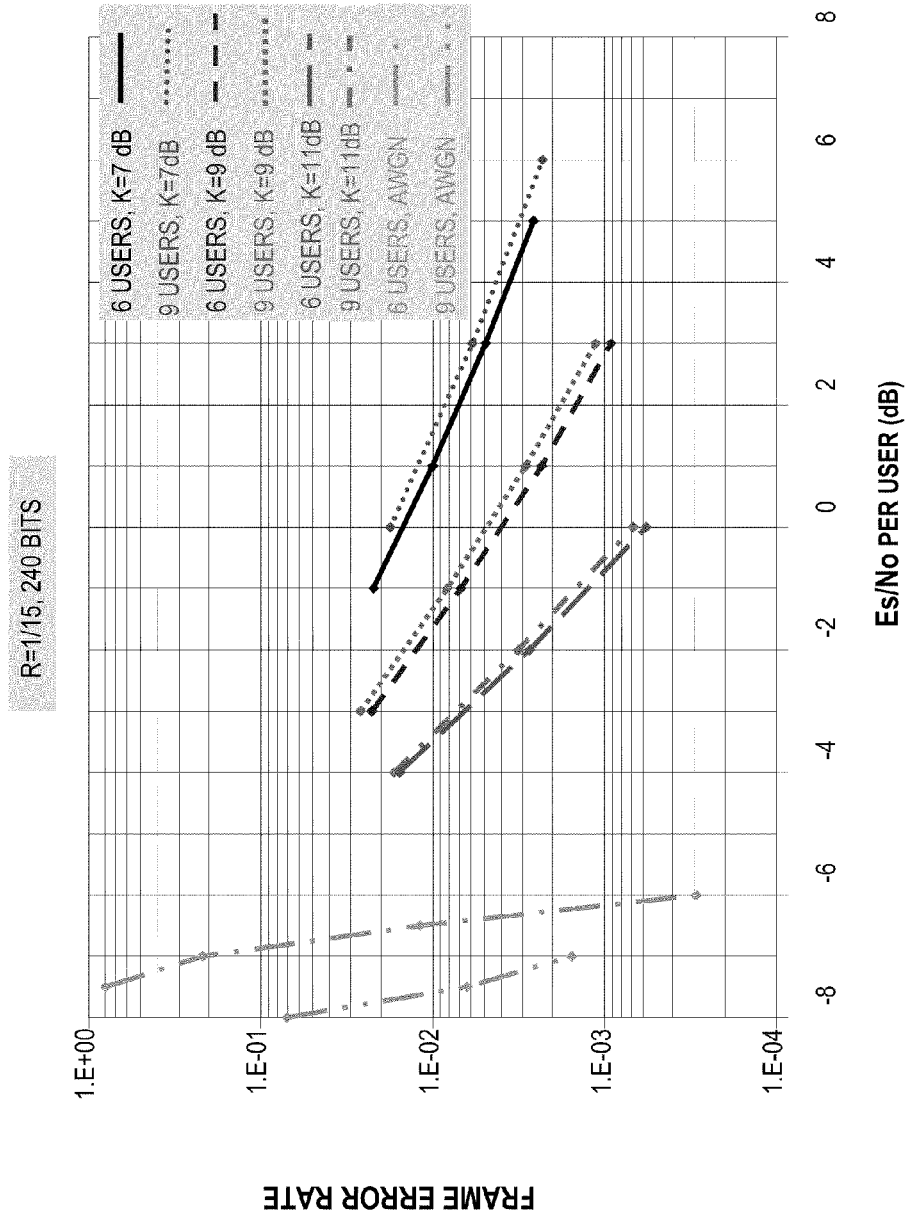
Figure 14C:
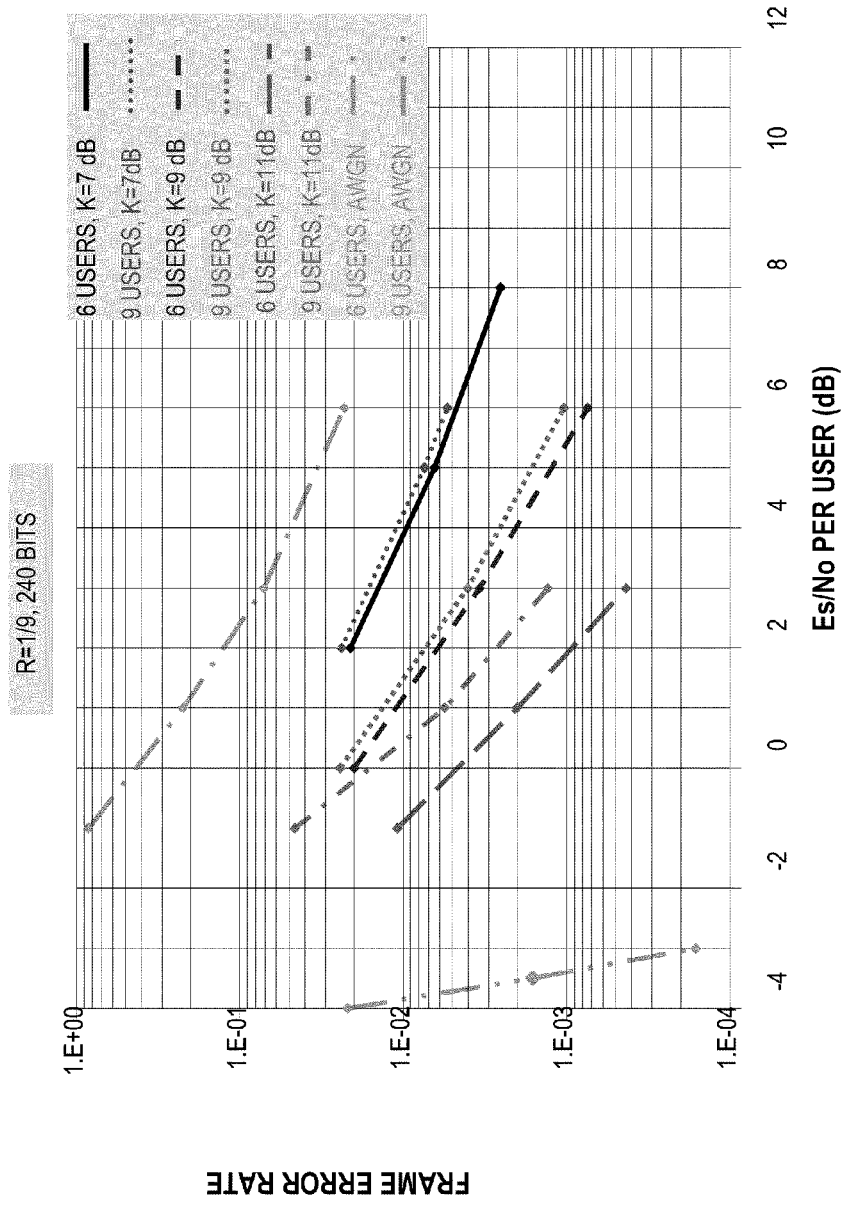
Figure 14D:
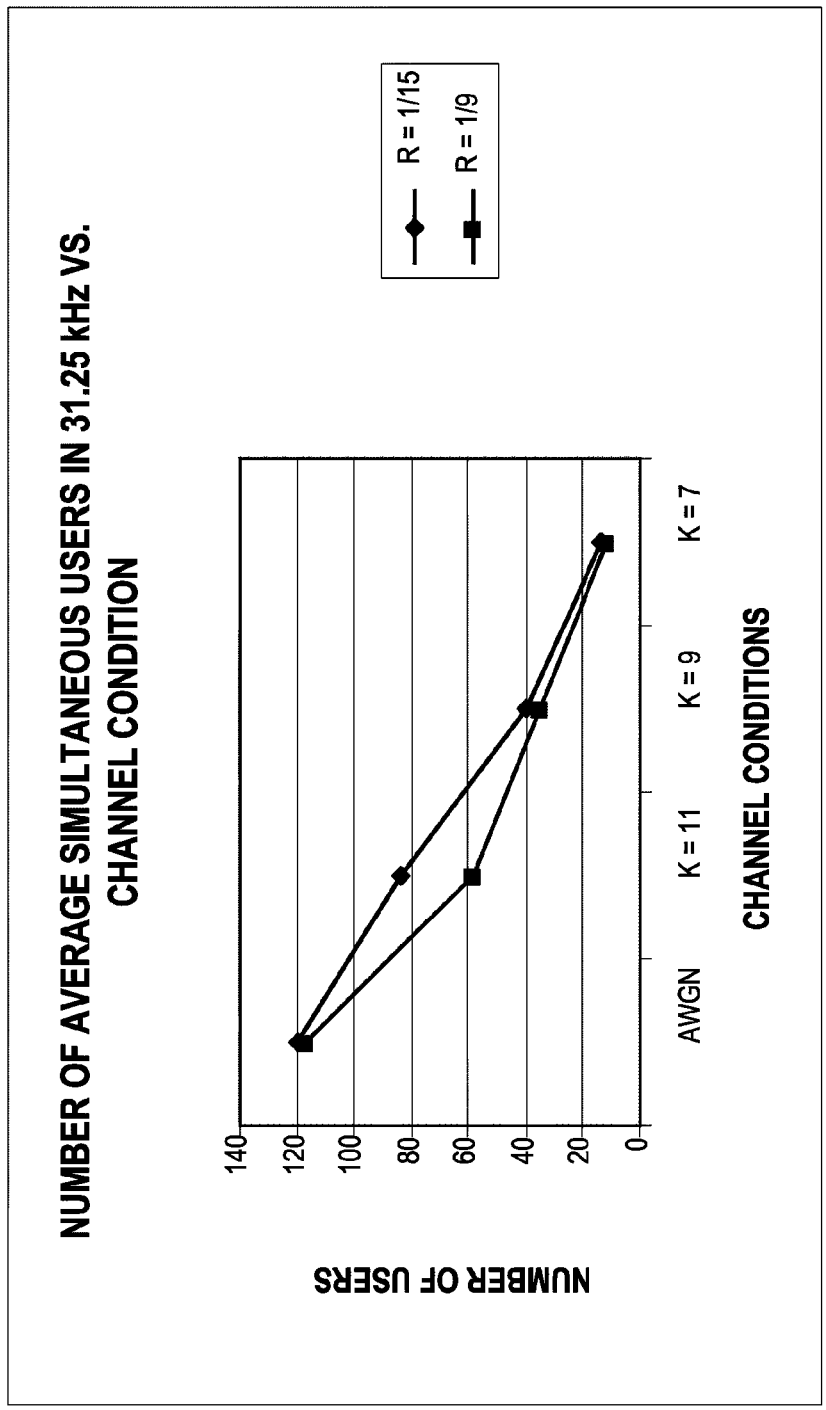
Figure 14E:
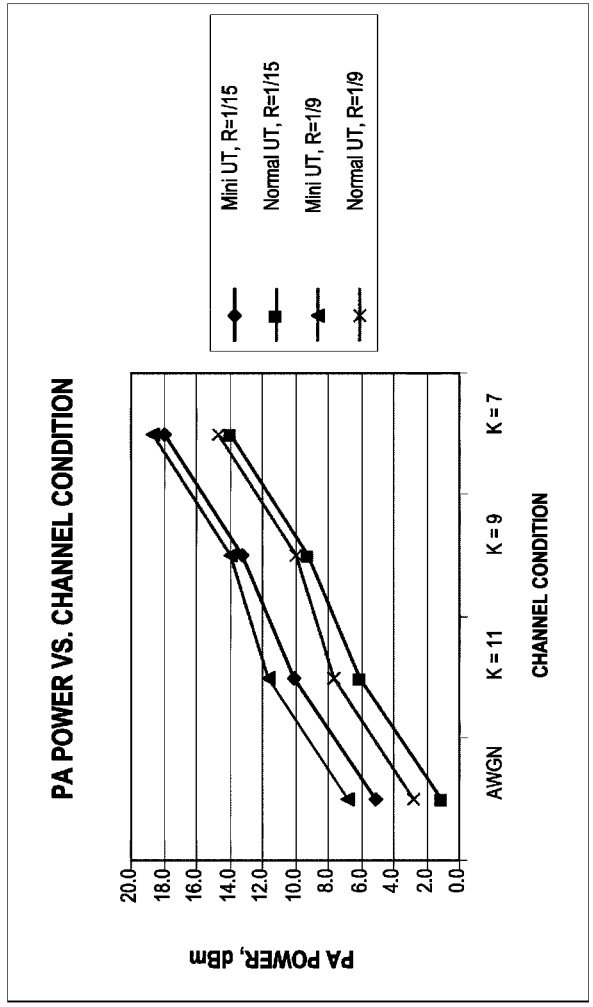
Figure 14F:
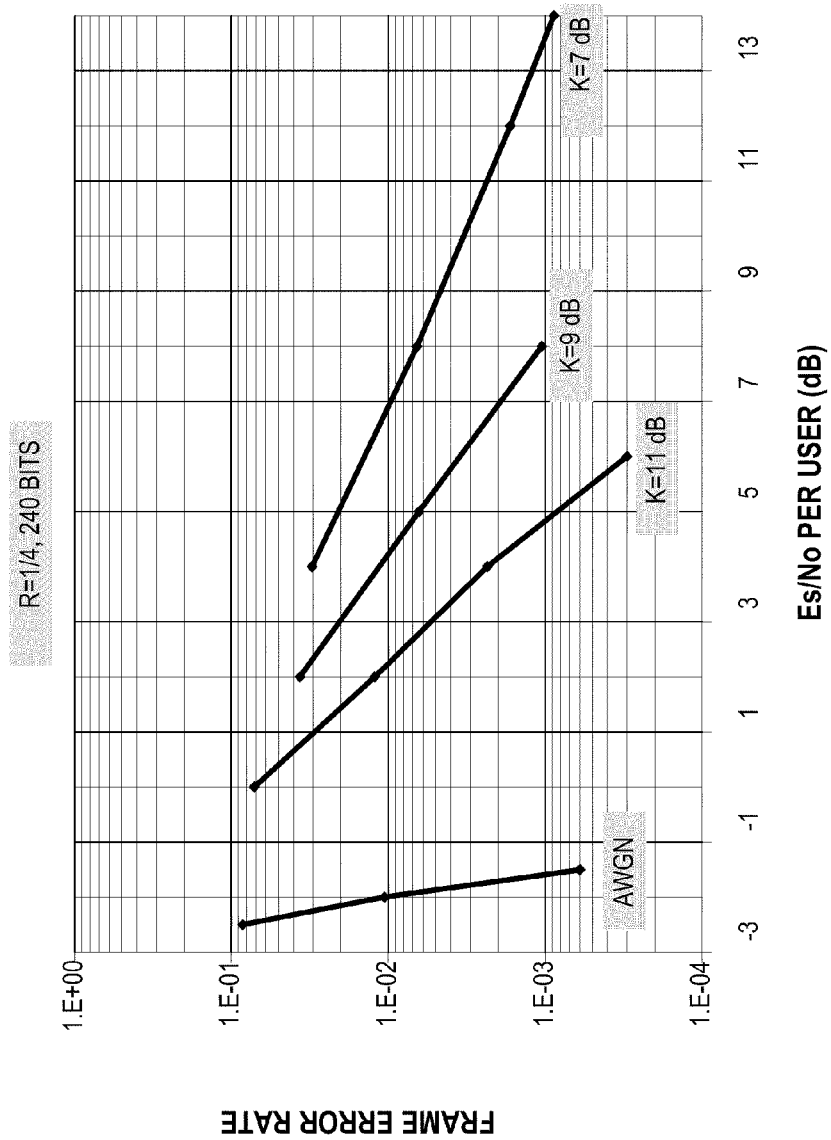
Figure 14G:
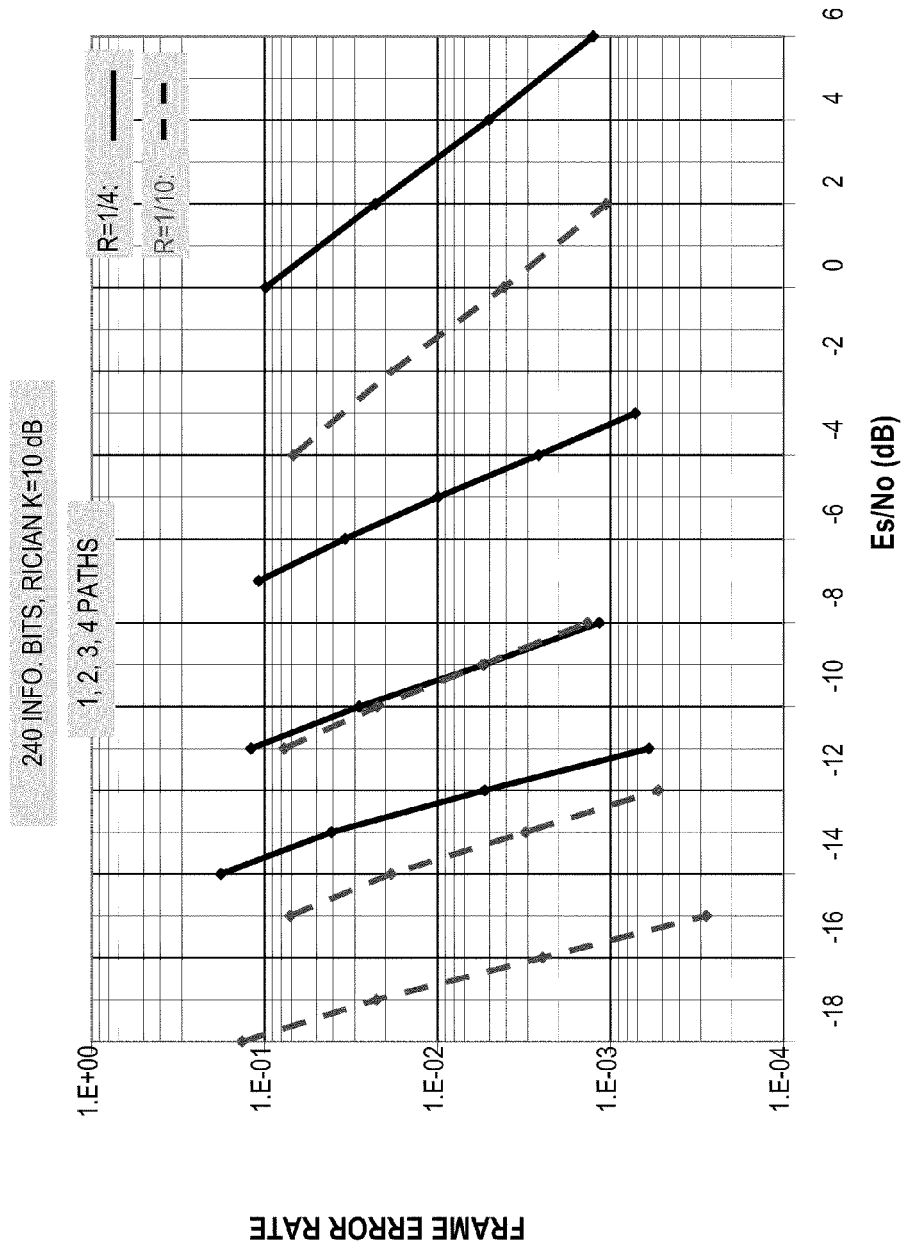
Figure 14H:
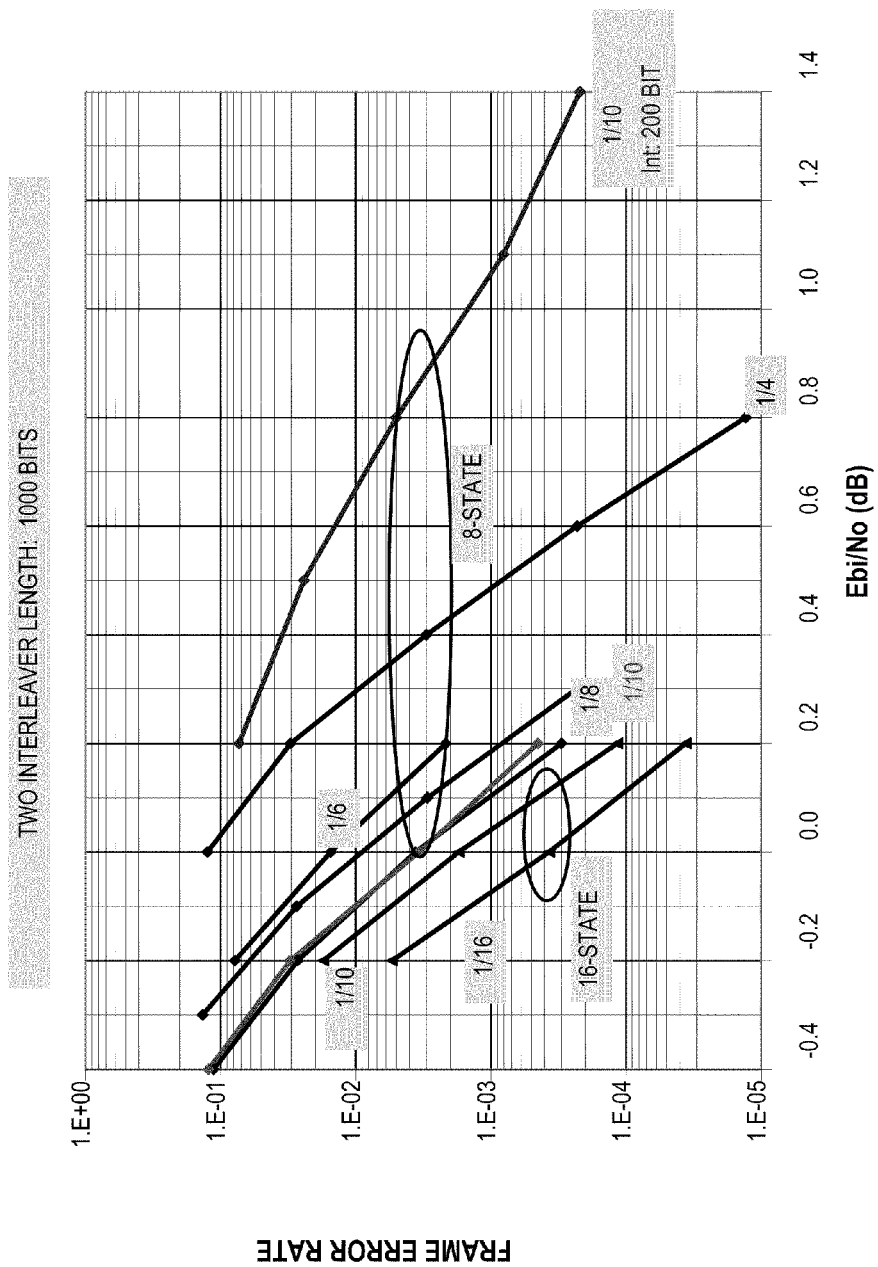

FIGS. 12 and 13 are diagrams of constituent encoders configured to provide low rate turbo codes, in accordance with various exemplary embodiments. A constituent encoder 1200 provides code rates of 1/14, 1/12, 1/10, 1/8, 1/6, and 1/4. When implemented in the turbo encoder 1001 of FIG. 10, the encoder 1001 does not output the information bits given these code rates. For rate 1/14 turbo code, all seven parity bits of the constituent code are transmitted. For rate 1/12 turbo code, $Y_6$ is punctured from both constituent codes, for rate 1/10 turbo code $Y_5$ and $Y_6$ are punctured, for rate 1/8 turbo code, $Y_4, Y_5$ and $Y_6$ are punctured, for rate 1/6 turbo code $Y_3, Y_4, Y_5$ and $Y_6$ are punctured and for rate 1/4 turbo code, $Y_2, Y_3, Y_4, Y_5$ and $Y_6$ are punctured from both constituent codes. The transfer function of the constituent encoder 1200 is given as:

$$G(D) = \left[\frac{n_0(D)}{d(D)}, \frac{n_1(D)}{d(D)}, \ldots \frac{n_6(D)}{d(D)}\right]$$

where, $d(D)=1+D+D^3$ $n_0(D)=1+D^2+D^3$ $n_1(D)=1+D+D^2+D^3$ $n_2(D)=1+D^3$ $n_3(D)=1+D+D^2$ $n_4(D)=1+D$ $n_5(D)=1+D^2$ $n_6(D)=1.$ As seen, the logic or circuitry for the encoder 1200 encompasses adders 1201, 1203, 1205, 1207, 1209, 1211, 1213, and 1215 and shift registers 1217, 1219 and 1221. Modular adder 1201 receives the data input, adding it together with the output of registers 1217 and 1221. The output of adder 1201 produces the parity bit $Y_6$ and is also fed into adders 1203, 1211, 1209 and 1205. Modular adder 1203 sums the signals from adder 1201 and register 1217, resulting in the parity bit $Y_4$; the summed value is additionally provided to adder 1207. Adder 1205 receives inputs from register 1219 and adder 1201, and produces the parity bit $Y_5$ at its output.

Further, adder 1207 sums the values from adder 1203 and register 1219 to generate parity bit $Y_3$. Adder 1209 receives inputs from register 1219 and adder 1201 to produce a value, which is then fed into adder 1213. Adder 1211 adds the value from register 1221 as well as the value from adder 1201; the resultant value is the parity bit $Y_2$. As for adder 1213, this adder 1213 produces parity bit $Y_0$ from the summation of a value from adder 1209 and register 1221. Adder 1215 receives inputs from adder 1213 and register 1221 to generate parity bit $Y_1$.

FIG. 13 shows a block diagram of a constituent encoder 1300 for achieving varying code rates, such as 1/15. The transfer function of the constituent encoder 1300 is as follows:

$$G(D) = \left[\frac{n_0(D)}{d(D)}, \frac{n_1(D)}{d(D)}, \ldots \frac{n_6(D)}{d(D)}\right]$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D$.

To generate the parity bits according to this transfer function, the constituent encoder 1300 has circuitry that includes modular adders 1301, 1303, 1305, 1307, 1309, 1311, 1313, 1315, and 1317 and shift registers 1319, 1321, and 1323.

As seen, modular adder 1301 adds the output of register 1323 with the data input and generates parity bit $Y_0$, which is also supplied into adders 1305, 1303, 1311, and 1307. Adder 1303 receives input from adder 1301 and register 1319, summing these inputs for a resultant value that is fed into adder 1313. At adder 1305, signals from adder 1301 and register 1319 are summed to yield parity bit $Y_6$—which is also fed into adder 1309.

Adder 1307 adds the input from adder 1301 and the input from register 1321, to provide parity bit $Y_1$. Parity bit $Y_5$ can be generated through the summation, at adder 1309, of the values from adder 1305 and register 1321. With respect to adder 1311, inputs from adder 1301 and register 1321 are added by adder 1311 and provided to adder 1315. Adder 1313 receives input from adder 1303 and register 1323 to generate parity bit $Y_4$. Parity bit $Y_2$ is formed by the addition of the result from adder 1311 and content of register 1323. Adder 1317 receives inputs from adder 1315 and register 1319 and produces parity bit $Y_3$ at its output. Under this arrangement (i.e., code rate of 1/15), the turbo encoder 1001 of FIG. 10 outputs the systematic bit, by contrast to the constituent encoders 1200, 1300 of FIGS. 12 and 13, respectively, in which no information bit is output by the turbo encoder 1001.

It should be noted that, according to certain embodiments, the low rate turbo codes described herein have been developed by targeting minimum Hamming weight corresponding to information sequences with Hamming weight more than two. Using this approach, a search for new turbo codes was conducted using a uniform interleaving assumption and constraining the Hamming weight of input sequences to a maximum of six, for instance.

FIGS. 14A-14H are graphs illustrating the performance of the SSCMA scheme. Specifically, graphs 1400, 1410, and 1420 illustrate performance of the SSCMA system 600 of FIG. 6 when relatively short 240 and 1000 information bit frame length packets are transmitted over White Gaussian Noise (AWGN) and Rician channels (e.g., using rate 1/9 or 1/15 turbo codes) without any spreading. Graph 1400 illustrates PER versus required energy per symbol over one-sided noise spectral density ratio (Es/No) per user for packet lengths of 240 and 1000 information bits for rate 1/15 turbo code. It can be noticed that there is little difference in required Es/No between these two lengths for this code rate.

Graphs 1410 and 1420 illustrate performance of PER vs. Es/No per user under various channel conditions for packet length of 240 information bits. It is shown that rate 1/15 code can be about 2.8 dB better than rate 1/9 code with 2.2 dB resulting from rate reduction. Also, it can be noticed that there is little difference between 6 and 9 users for all cases except for rate 1/9 over Rician channel of k=11 dB.

It is of interest to note that multipath can help to spread out the SSCMA self interference more than the Gaussian case, thereby enjoys better performance as the number of users reaches the value M in a rate 1/M code. The required per user Es/No to achieve $2\times10^{-3}$ PER is summarized in Table 1 for various scenarios. It is noted that the Es here is without spreading. Should spreading be employed, the corresponding Es would be lower by $10\times\log(F)$, where F is the spreading factor.

TABLE 1

| | | Packet Lengths, Info Bits | | | |
| | | 240 | | 1000 | |
| Code Rate | | 1/15 | 1/9 | 1/15 | 1/9 |
|---|---|---|---|---|---|
| AWGN | 6 Users | −7.2 | −3.5 | −7.3 | |
| | 9 Users | −6.3 | | −6.7 | |
| K = 11 dB | 6 Users | −1.6 | 1.0 | −1.9 | |
| | 9 Users | −1.4 | 2.4 | −1.4 | |
| K = 9 dB | 6 Users | 1.3 | 4.0 | | |
| | 9 Users | 1.8 | 4.6 | | |
| K = 7 dB | 6 Users | 5.9 | 8.8 | 5.8 | |
| | 9 Users | 6.4 | 9.2 | | |

Graph 1430 illustrates average number of simultaneous users that can be employed in, for example, system 600 to use a channel bandwidth of 31.25 kHz using 217 bps data rate and packets of 240 information bits. Graph 1430 is based on various channel conditions. It is noted that maximum average number of simultaneous users can be limited by code rate and spread factor for a SSCMA scheme. For example, for a code rate of 1/15 and a spread factor of 26, maximum average number of simultaneous users is 15×16/2=120. Also, for a code rate of 1/9 and a spread factor of 26, maximum average number of simultaneous users is 9×26/2=117.

Graph 1440 illustrates required power amplifier (PA) power in dBm for different channel conditions, code rates, and two kinds of terminals. According to certain embodiments, there can be several differences between mini and normal terminals such as antenna gain. For example, an antenna gain for a mini terminal can be around −1 dBi and for a normal terminal can be around 3 dBi. According to one embodiment, available power amplifiers without driver amplifier can offer power around 15 dBm. Therefore, if the channel can be characterized as a Rician channel with K≥9 dB, a mini terminal using a PA of no more that 15 dBm can be used in the applications discussed above.

Graphs 1450, 1460, and 1470 illustrate the performance of the SSCMA system of FIG. 6 on a forward path (e.g., from hub 131 to terminal (such as ST and/or UT 123, 125, 127, and/or 129). Graph 1450 illustrates PER versus required Es/No per user for transmission of a packet length of 240 information bit over various channel conditions. In the exemplary embodiment of graph 1450, a code rate of 1/4 is employed. Further, graph 1460 illustrates performance of PER versus Es/No per user over Rician channel of K=10 dB for two code rates. It can be noticed that code rate 1/10 performs about 4.3 dB better than code rate 1/4 with 4 dB resulting from rate reduction. Required Es/No for achieving a $2 \times 10^{-3}$ PER over a Rician channel of K=7 dB is about 13.2 dB higher than that is required over an AWGN channel. However, this required fade margin can be greatly reduced to about 6.2 dB over a Rician channel of K=10 dB. Graph 1470 also illustrates PER versus the required energy per information bit to one-sided noise spectral density ratio (Ebi/No) per user for packet length of 1000 information bits using various turbo codes under various channel conditions. Required Es/No per user at $2 \times 10^{-3}$ PER is summarized in Table 2 for various scenarios of interest.

TABLE 2

|  | Packet Lengths, Info Bits | | | |
|---|---|---|---|---|
|  | 240 | | 1000 | |
| Code Rate | 1/4 | 1/10 | 1/4 | 1/10 |
| AWGN | −1.7 |  | −2.6 | −6.7 |
| K = 11 dB | 4.2 |  |  |  |
| K = 10 dB | 5.3 | 1.0 |  |  |
| K = 9 dB | 6.9 |  |  |  |
| K = 7 dB | 11.5 |  |  |  |

According to another exemplary embodiment, performance of a SSCMA system 600 of FIG. 6 can be considered that employ 64 terminals (e.g., user) with on a Rician channel return path with K=10 dB. Also, in this example, the system 600 can employ a rate of 220 bps, code rate of 1/15, QPSK modulation, over a 31.25 kHz channel using a spread factor of 16. Burst length is 30 bytes (including overhead) and residual frequency error due to non-ideal Doppler cancellation is not greater than 10 Hz. Achieved PER for the system with the above parameters is summarized in Table 3 for UW symbols of lengths 2047 and 4095 bits.

TABLE 3

| Ec/No, dB | UW Length, bits | PER | w/Miss Probability |
|---|---|---|---|
| −13 | 2047 | $1.9 \times 10^{-3}$ | $3.2 \times 10^{-3}$ |
| −15 | 2047 | $0.0 \times 10^{-2}$ | $1.4 \times 10^{-2}$ |

TABLE 3-continued

| Ec/No, dB | UW Length, bits | PER | w/Miss Probability |
|---|---|---|---|
| −13 | 4095 | $1.4 \times 10^{-3}$ | $1.9 \times 10^{-3}$ |
| −15 | 4095 | $8.4 \times 10^{-3}$ | $9 \times 10^{-3}$ |

Also, Table 4 summarizes achieved PER for similar system considering 14 terminals and K=7 dB for UW symbols of lengths 2047 and 4095 bits:

TABLE 4

| Ec/No, dB | UW Length, bits | PER | w/Miss Probability |
|---|---|---|---|
| −8 | 2047 | $4.2 \times 10^{-4}$ | $4.8 \times 10^{-3}$ |
| −8 | 4095 | $4.4 \times 10^{-4}$ | $4.8 \times 10^{-3}$ |
| −9 | 2047 | $8.8 \times 10^{-4}$ | $3.0 \times 10^{-3}$ |
| −9 | 4095 | $9.1 \times 10^{-4}$ | $2.3 \times 10^{-3}$ |

In the return link, the combination of low-rate code and SSCMA allows the terminal to operate autonomously with minimum coordination with the hub. Unlike conventional CDMA, interference cancellation operates better when the terminals are not operating at exactly the same power, tight power control is in fact not desirable. The bandwidth expansion from the low-rate coding serves two purposes reduction of emission spectral density from regulator standpoint; and additional coding gain.

The processes described herein for generating low rate codes and scrambling may be implemented via software, hardware (e.g., general processor, Digital Signal Processing (DSP) chip, an Application Specific Integrated Circuit (ASIC), Field Programmable Gate Arrays (FPGAs), etc.), firmware or a combination thereof.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method, comprising:
    encoding a first bit stream of a first terminal based on a turbo encoding scheme, scrambling the encoded first bit stream according to a first scrambling signature with a first initial vector, and spreading the scrambled and encoded first bit stream to match a communication channel bandwidth;
    encoding a second bit stream of a second terminal based on the turbo encoding scheme, scrambling the encoded second bit stream according to a second scrambling signature with a second initial vector, and spreading the scrambled and encoded second bit stream to match the communication channel bandwidth; and
    outputting a composite signal based on the turbo encoded first bit stream and the turbo encoded second bit stream;
    wherein the use of the first initial vector with the first scrambling signature for the first bit stream and the second initial vector with the second scrambling signature for the second bit stream serves to distinguish the first bit stream of the first terminal from the second bit stream of the second terminal to provide a multiple access scheme; and
    wherein the turbo code encoding utilizes constituent encoding having a transfer function:

$$G(D) = \left[\frac{n_0(D)}{d(D)}, \frac{n_1(D)}{d(D)}, \ldots \frac{n_6(D)}{d(D)}\right]$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D$.

2. A method according to claim 1, wherein the encoded bit streams are based on a low code rate of R/F, where R is a forward error correction (FEC) code rate, and F is a spreading factor.

3. A method according to claim 1, wherein the spreading is performed using at least one of direct-sequence spread spectrum, frequency-hopping spread spectrum, chirp spread spectrum, and time-hopping spread spectrum.

4. A method according to claim 1, wherein at least one of the first and second terminals is a data collection platform or a supervisory control and data acquisition platform.

5. A system, comprising:
a first terminal, including a first encoder module configured to encode a first bit stream based on a turbo encoding scheme, a first scrambler module configured to scramble the encoded first bit stream according to a first scrambling signature with a first initial vector, and a first spreader module configured to spread the scrambled and encoded first bit stream to match a communication channel bandwidth;
a second terminal, including a second encoder module configured to encode a second bit stream based on the turbo encoding scheme, a second scrambler module configured to scramble the encoded second bit stream according to a second scrambling signature with a second initial vector, and a second spreader module configured to spread the scrambled and encoded second bit stream to match the communication channel bandwidth;
wherein a composite signal is output based on the turbo encoded first bit stream and the turbo encoded second bit stream;
wherein the use of the first initial vector with the first scrambling signature for the first bit stream and the second initial vector with the second scrambling signature for the second bit stream serves to distinguish the first bit stream of the first terminal from the second bit stream of the second terminal to provide a multiple access scheme; and
wherein the turbo code encoding utilizes constituent wherein the encoding utilizes constituent encoding having a transfer function:

$$G(D) = \left[\frac{n_0(D)}{d(D)}, \frac{n_1(D)}{d(D)}, \ldots \frac{n_6(D)}{d(D)}\right]$$

where, $d(D)=1+D^3$ $n_0(D)=1$ $n_1(D)=1+D^2$ $n_2(D)=1+D^2+D^3$ $n_3(D)=1+D+D^2+D^3$ $n_4(D)=1+D+D^3$ $n_5(D)=1+D+D^2$ $n_6(D)=1+D$.

6. A system according to claim 5, wherein the encoded bit streams are based on a low code rate of R/F, where R is a forward error correction (FEC) code rate, and F is a spreading factor.

7. A system according to claim 5, wherein at least one of the first spreader module and the second spreader module comprises at least one of a direct-sequence spreader, a frequency hopping spreader, a chip spreader, and a time-hopping spreader.

8. A system to claim 5, wherein at least one of the first and second terminals is a data collection platform or a supervisory control and data acquisition platform.

* * * * *